(12) United States Patent
Moriya

(10) Patent No.: US 10,890,484 B2
(45) Date of Patent: Jan. 12, 2021

(54) WAVELENGTH MEASURING DEVICE

(71) Applicant: Gigaphoton Inc., Tochigi (JP)

(72) Inventor: Masato Moriya, Oyama (JP)

(73) Assignee: Gigaphoton Inc., Tochigi (JP)

( * ) Notice: Subject to any disclaimer, the term of this patent is extended or adjusted under 35 U.S.C. 154(b) by 198 days.

(21) Appl. No.: 16/150,298

(22) Filed: Oct. 3, 2018

(65) Prior Publication Data

US 2019/0033133 A1    Jan. 31, 2019

Related U.S. Application Data

(63) Continuation of application No. PCT/JP2016/064877, filed on May 19, 2016.

(51) Int. Cl.
*G01J 3/26* (2006.01)
*H01S 3/139* (2006.01)
(Continued)

(52) U.S. Cl.
CPC .............. *G01J 3/26* (2013.01); *G01J 1/429* (2013.01); *G01J 3/021* (2013.01);
(Continued)

(58) Field of Classification Search
CPC .............. G01J 3/26; G01J 1/429; G01J 3/021
See application file for complete search history.

(56) References Cited

U.S. PATENT DOCUMENTS 5,748,316 A    5/1998  Wakabayashi et al.
5,978,394 A *  11/1999  Newman ............... H01S 3/1055
                                                372/32
(Continued)

FOREIGN PATENT DOCUMENTS

CN    101718701 A    6/2010
EP    1072938 A2    1/2001
(Continued)

OTHER PUBLICATIONS

International Search Report issued in corresponding International Application No. PCT/JP2016/064877; dated Jul. 19, 2016.
(Continued)

*Primary Examiner* — Hugh Maupin
(74) *Attorney, Agent, or Firm* — Studebaker & Brackett PC

(57) ABSTRACT

A wavelength measuring device configured to detect a wavelength of ultraviolet laser light outputted from a laser resonator with at least one etalon, the wavelength measuring device includes: a first housing having an interior space being sealed and accommodating the etalon, an input window through which the ultraviolet laser light enters to the first housing, the input window being provided at a first opening of the first housing, a first sealing member configured to seal a gap between a rim part of the input window and a circumferential portion of the first opening, a shielding film provided between the rim part of the input window and the first sealing member and configured to shield the first sealing member from the ultraviolet laser light coming from the input window, and a diffusing element provided outside of the first housing and configured to diffuse the ultraviolet laser light before being incident on the input window.

20 Claims, 13 Drawing Sheets

(51) Int. Cl.

| | | |
|---|---|---|
| *G01J 3/02* | (2006.01) | |
| *G01J 1/42* | (2006.01) | |
| *H01S 3/137* | (2006.01) | |
| *G03F 7/20* | (2006.01) | |
| *H01S 3/0971* | (2006.01) | |
| *H01S 3/08* | (2006.01) | |
| *H01S 3/225* | (2006.01) | |
| *H01S 3/00* | (2006.01) | |

(52) U.S. Cl.
CPC ........ *G03F 7/70025* (2013.01); *G03F 7/7085* (2013.01); *G03F 7/70341* (2013.01); *G03F 7/70575* (2013.01); *H01S 3/137* (2013.01); *H01S 3/139* (2013.01); *H01S 3/005* (2013.01); *H01S 3/08004* (2013.01); *H01S 3/08009* (2013.01); *H01S 3/0971* (2013.01); *H01S 3/2251* (2013.01)

(56) References Cited

U.S. PATENT DOCUMENTS

| | | | |
|---|---|---|---|
| 6,426,966 B1* | 7/2002 | Basting | H01S 3/08004 |
| | | | 372/100 |
| 2002/0021728 A1 | 2/2002 | Newman et al. | |
| 2003/0137672 A1 | 7/2003 | Moriya et al. | |
| 2010/0275845 A1* | 11/2010 | Kogure | C23C 16/4409 |
| | | | 118/722 |
| 2015/0340837 A1* | 11/2015 | Matsunaga | H01S 3/08004 |
| | | | 372/20 |
| 2017/0222391 A1* | 8/2017 | Moriya | G01J 9/0246 |

FOREIGN PATENT DOCUMENTS

| | | |
|---|---|---|
| JP | H01-123491 A | 5/1989 |
| JP | H01-183871 A | 7/1989 |
| JP | H05-167135 A | 7/1993 |
| JP | H06-029160 A | 2/1994 |
| JP | H06-029160 U | 4/1994 |
| JP | H06-112571 A | 4/1994 |
| JP | H06-188502 A | 7/1994 |
| JP | H07-120326 A | 5/1995 |
| JP | 2000-232246 A | 8/2000 |
| JP | 2000-266605 A | 9/2000 |
| JP | 2001 042369 A | 2/2001 |
| JP | 2002-277328 A | 9/2002 |
| JP | 2003-185502 A | 7/2003 |
| JP | 2003-214958 A | 7/2003 |
| JP | 2006-184077 A | 7/2006 |
| JP | 2007-061855 A | 3/2007 |
| JP | 2015-525342 A | 9/2015 |
| WO | 2014/035505 A2 | 3/2014 |

OTHER PUBLICATIONS

International Preliminary Report on Patentability issued in corresponding International Application No. PCT/JP2016/064877; dated Nov. 20, 2018.

An Office Action issued by the State Intellectual Property Office of the People's Republic of China dated Jun. 11, 2020, which corresponds to Chinese Patent Application No. 201680084506.2 and is related to U.S. Appl. No. 16/150,298 with English language translation.

An Office Action mailed by the Japanese Patent Office dated Apr. 28, 2020, which corresponds to Japanese Patent Application No. 2018-518020 and is related to U.S. Appl. No. 16/150,298 with English language translation.

* cited by examiner

WAVELENGTH MEASURING DEVICE

CROSS-REFERENCE TO RELATED APPLICATIONS

The present application is a continuation application of International Application No. PCT/JP2016/064877 filed on May 19, 2016. The content of the application is incorporated herein by reference in its entirety.

TECHNICAL FIELD

The present disclosure relates to a wavelength measuring device that detects the central wavelength of ultraviolet laser light.

BACKGROUND ART

The recent miniaturization and increased levels of integration of semiconductor integrated circuits have led to a demand for increases in resolutions of semiconductor exposure apparatuses. A semiconductor exposure apparatus is hereinafter referred to simply as "exposure apparatus". Accordingly, exposure light sources to output light at shorter wavelengths have been under development. As the exposure light sources, gas laser apparatuses instead of conventional mercury lamps are typically used. The gas laser apparatuses for exposure include a KrF excimer laser apparatus that outputs an ultraviolet laser beam at a wavelength of 248 nm and an ArF excimer laser apparatus that outputs an ultraviolet laser beam at a wavelength of 193 nm.

As a current exposure technology, immersion exposure has been put to practical use. In the immersion exposure, a gap between a projection lens and a wafer in an exposure apparatus is filled with a fluid such as water to change refractive index in the gap such that an apparent wavelength of the light from the exposure light source is shortened. In a case where immersion exposure is performed using an ArF excimer laser apparatus as an exposure light source, a wafer is irradiated with ultraviolet light whose wavelength in water is equivalent to 134 nm. This technology is referred to as "ArF immersion exposure". The ArF immersion exposure is also referred to as "ArF immersion lithography".

Spectrum line widths of KrF and ArF excimer laser apparatuses in natural oscillation are as wide as approximately 350 pm to 400 pm. This causes a chromatic aberration of an ultraviolet laser beam that is subjected to reduced projection onto a wafer by a projection lens in an exposure apparatus. The chromatic aberration thus causes a reduction in resolving power. Accordingly, spectrum line width of a laser beam that is outputted from a gas laser apparatus needs to be narrowed to such an extent that the chromatic aberration can be ignored. To narrow the spectrum width, a laser resonator of a gas laser apparatus is equipped with a line narrow module having a line narrow element. The line narrow element may be an etalon, a grating, or the like. A laser apparatus whose spectrum width is narrowed in this way is referred to as "line narrowed laser apparatus".

A wavelength measuring device known in the art is used for such laser apparatus to detect the central wavelength of the ultraviolet laser light outputted from the laser resonator. The wavelength measuring device receives a part of the ultraviolet laser light outputted from the laser resonator as a sample beam to monitor whether or not the ultraviolet laser light outputted from the laser resonator has a central wavelength equivalent to a target value. A wavelength controller controls the laser resonator, based on the central wavelength detected by the wavelength measuring device, such that the central wavelength of the ultraviolet laser light approaches the target value.

Patent Document 1: Japanese Patent Application Publication No. 2003-214958 A
Patent Document 2: Japanese Utility Model Application Publication No. H01-029160 A
Patent Document 3: Japanese Patent Application Publication No. H01-0183871 A

SUMMARY

An aspect of the present disclosure relates to a wavelength measuring device configured to detect a wavelength of ultraviolet laser light outputted from a laser resonator with at least one etalon, comprising a first housing, an input window, a first sealing member, a shielding film, and a diffusing element. The first housing has an interior space being sealed and accommodating the etalon. The input window, through which the ultraviolet laser light enters to the first housing, is provided at a first opening of the first housing. The first sealing member is configured to seal a gap between a rim part of the input window and a circumferential portion of the first opening. The shielding film is provided between the rim part of the input window and the first sealing member and is configured to shield the first sealing member from the ultraviolet laser light coming from the input window. The diffusing element is provided outside of the first housing and configured to diffuse the ultraviolet laser light before being incident on the input window.

BRIEF DESCRIPTION OF DRAWINGS

Exemplary embodiments of the present disclosure will be described below as mere examples with reference to the appended drawings.

DESCRIPTION OF EMBODIMENTS

<Contents>
1. Line Narrowed Laser Apparatus Using Wavelength Measuring Device According to Comparative Example
   1.1 Laser Chamber
   1.2 Monitoring Module
      1.2.1 Second Unit
      1.2.2 First Unit
         1.2.2.1 Diffusing Plate
         1.2.2.2 First Etalon Spectrometer and Second. Etalon Spectrometer
         1.2.2.3 First Housing
   1.3 Exposure Apparatus
   1.4 Laser Controller
   1.5 Wavelength Controller
   1.6 Operation
2. Problem
3. Line Narrowed Laser Apparatus Using Wavelength Measuring Device According to First Embodiment
   3.1 Configuration
   3.2 Operation
   3.3 Effect
4. Wavelength Measuring Device According to Second Embodiment
   4.1 Configuration
   4.2 Effect
   4.3 Modified Example
5. Wavelength Measuring Device According to Third Embodiment
   5.1 Configuration
   5.2 Effect
6. Wavelength Measuring Device According to Fourth Embodiment
   6.1 Configuration
   6.2 Effect
7. Wavelength Measuring Device According to Reference Example
8. Others Embodiments of the present disclosure will be described in detail below with reference to the drawings. The embodiments described below indicate several examples of the present disclosure, and may not intend to limit the content of the present disclosure. Not all of the configurations and operations described in the embodiments are indispensable in the present disclosure. Identical reference symbols are assigned to identical constituent elements and redundant descriptions thereof are omitted.

Figure 1:
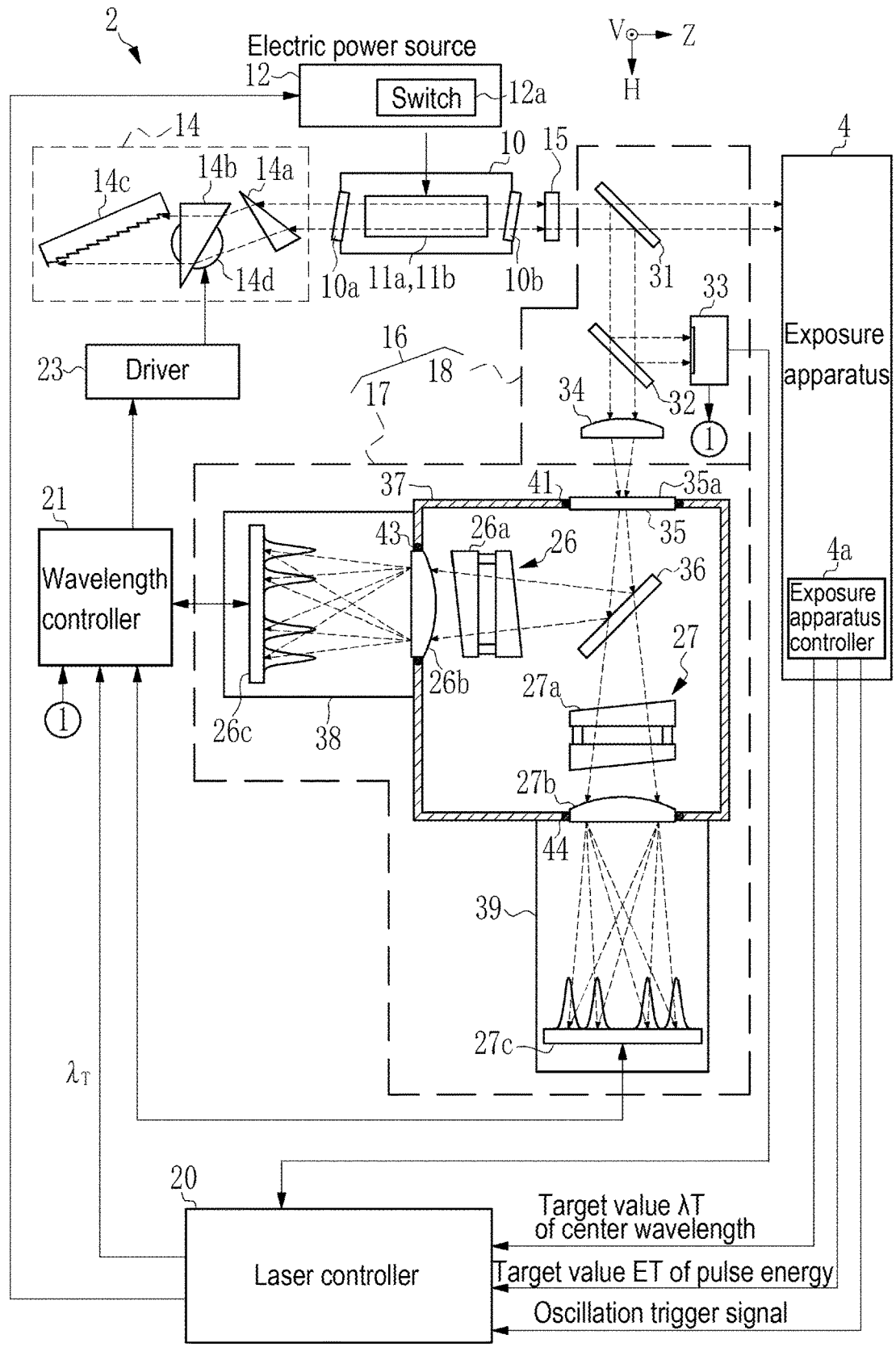
FIG. 1 schematically shows a configuration of a line narrowed laser apparatus that uses a wavelength measuring device according to a comparative example.

1. Overall Description of Line Narrowed Laser Apparatus According to Comparative Example FIG. 1 schematically shows a configuration of a line narrowed laser apparatus 2 according to a comparative example. This example shows a situation where the line narrowed laser apparatus 2 is used with an exposure apparatus 4. The line narrowed laser apparatus 2 includes a laser resonator configured by a laser chamber 10, a pair of discharge electrodes 11a and 11b, an electric power source 12, a line narrow module 14, and an output coupling mirror 15. The laser resonator outputs a pulse laser beam including ultraviolet laser light. In this example, the traveling direction of the pulse laser beam outputted from the output coupling mirror 15 is a Z direction. The direction of electric discharge between the discharge electrodes 11a and 11b is a V direction or a −V direction. The direction perpendicular to both these directions is an H direction.

The line narrowed laser apparatus 2 further includes a monitoring module 16, a laser controller 20, a wavelength controller 21, and a driver 23. The monitoring module 16 includes a first unit 17 and a second unit 18. The first unit 17 includes a first etalon spectrometer 26 and a second etalon spectrometer 27.

1.1 Laser Resonator

The laser chamber 10 contains a laser gas including, for example, a rare gas such as argon gas or krypton gas, a halogen gas such as fluorine gas or chlorine gas, and a buffer gas such as neon gas or helium gas. Windows 10a and 10b are provided at both ends of the laser chamber 10.

The discharge electrodes 11a and 11b are provided in the laser chamber 10 as electrodes for exciting the laser medium by an electric discharge. A pulsed high voltage from the electric power source 12 is applied across the discharge electrodes 11a and 11b. The electric power source 12 includes an unillustrated charger and an unillustrated pulse power module. The pulse power module includes a switch 12a. The electric power source 12 generates, upon the switch 12a receives an oscillation trigger signal from the laser controller 20, the pulsed high voltage to be applied across the discharge electrodes 11a and 11b.

The high voltage applied across the discharge electrodes 11a and 11b causes an electric discharge between the discharge electrodes 11a and 11b. The laser medium in the laser chamber 10 is excited by the energy of the electric discharge to shift to a high energy level. The excited laser medium then shifts back to a low energy level to emit light according to the difference in the energy levels.

The windows 10a and 10b are arranged such that the plane of incidence of the light on each of these windows 10a and 10b substantially coincides with the HZ plane and the angle of incidence of the light on each of these windows 10a and 10b is substantially equal to the Brewster's angle. The light generated in the laser chamber 10 is emitted via the windows 10a and 10b to the outside of the laser chamber 10 as a pulse laser beam. The pulse laser beam includes a plurality of pulses. One pulse of the laser beam is generated from the laser chamber 10 according to one pulse of the oscillation trigger signal.

The line narrow module (LNM) 14 includes two or more prisms such as prisms 14a and 14b, a grating 14c, and a rotary stage 14d. The prisms 14a and 14b expand the beam width of the light from the window 10a of the laser chamber 10 in the H direction and cause the light to be incident on the grating 14c. Further, the prisms 14a and 14b reduce the beam width of the reflected light from the grating 14c in the H direction and cause the light to be returned via the window 10a to the electric discharge space in the laser chamber 10.

The surface of the grating 14c is made of a high-reflective material and multiple grooves are formed on the surface at a predetermined interval. The grating 14c constitutes a dispersion optical element. The cross-section of each of the grooves has, for example, a right triangular shape. The light that is incident on the grating 14c from the prisms 14a and 14b is reflected by the grooves and diffracted to directions according to the wavelengths of the light. The grating 14c is in a Littrow arrangement such that the angle of incidence of the light incident on the grating 14c from the prisms 14a and 14b coincides with the angle of diffraction of the diffracted light having the desired wavelength. The light around the desired wavelength is thus returned via the prisms 14a and 14b to the laser chamber 10.

The rotary stage 14d supports the prism 14b and rotates the prism 14b around an axis parallel to the V axis. Rotating the prism 14b causes the angle of incidence of the light on the grating 14c to be changed. Rotating the prism 14b thus causes the wavelength of the light returned from the grating 14c via the prisms 14a and 14b to the laser chamber 10 to be selected.

A surface of the output coupling mirror 15 is coated with a partially reflective film. The output coupling mirror 15 reflects a part of the laser beam outputted via the window 10b to the laser chamber 10 and transmits another part. The line narrow module 14 and the output coupling mirror 15 constitute an optical resonator. The light emitted from the laser chamber 10 reciprocates between the line narrow module 14 and the output coupling mirror 15, being amplified each time it passes through the electric discharge space between the discharge electrodes 11a and 11b, thus causes laser oscillation to be performed. Further, the arrangement of the windows 10a and 10b causes a polarized light component in the H direction to be selected. A part of the light thus being amplified is outputted as the pulse laser beam via the output coupling mirror 15 to the exposure apparatus 4.

1.2 Monitoring Module

The monitoring module 16 samples a part of the pulse laser beam outputted from the laser resonator. The monitoring module 16 then detects the pulse energy and the central wavelength of the sampled pulse laser beam.

1.2.1 Second Unit

The second unit 18 has a function of sampling a part of the pulse laser beam outputted from the laser resonator and a function of detecting the pulse energy. The second unit 18 includes a first beam splitter 31, a second beam splitter 32, an energy sensor 33, and a focusing lens 34.

The first beam splitter 31 is provided in an optical path of the pulse laser beam between the output coupling mirror 15 and the exposure apparatus 4. The first beam splitter 31 transmits a part of the pulse laser beam outputted via the output coupling mirror 15 at a high transmittance and reflects another part. The second beam splitter 32 is provided in an optical path of the pulse laser beam reflected by the first beam splitter 31. The second beam splitter 32 transmits a part of the pulse laser beam reflected by the first beam splitter 31 and reflects another part.

The energy sensor 33 is provided in an optical path of the pulse laser beam reflected by the second beam splitter 32. The energy sensor 33 measures the pulse energy of each pulse of the pulse laser beam reflected by the second beam splitter 32. The energy sensor 33 outputs measured data on the pulse energy to the laser controller 20. Upon detecting the pulse energy, the energy sensor 33 further outputs a detection signal showing one pulse is detected to the wavelength controller 21. The energy sensor 33 is configured by, for example, a photodiode, a photoelectric tube, or a pyroelectric element.

The focusing lens 34 converges the pulse laser beam transmitted by the second beam splitter 32. The first unit 17 is provided downstream from the focusing lens 34. The pulse laser beam converged by the focusing lens 34 is outputted to the first unit 17.

1.2.2 First Unit

The first unit 17 has a function of wavelength measurement to measure the central wavelength of the pulse laser beam. The first unit 17 corresponds to a wavelength measuring device. The first unit 17 includes, in addition to the first and second etalon spectrometers 26 and 27, a diffusing plate 35, a third beam splitter 36, a first housing 37, and sensor housings 38 and 39. The first housing 37 corresponds to a first housing and the diffusing plate 35 corresponds to a diffusing element.

1.2.2.1 Diffusing Plate

The diffusing plate 35 is configured, for example, by a plane-parallel plate being capable of transmitting the pulse laser beam. The diffusing plate 35 has a diffusing surface 35a formed on the surface on which the light is incident. The diffusing surface 35a is formed by a roughening process and has multiple projections and depressions. The roughening process is, for example, performed by a sandblasting process. The diffusing plate 35 scatters and diffuses the pulse laser beam at the diffusing surface 35a to emit the pulse laser beam as diffused light. The pulse laser beam emitted as the diffused light from the diffusing plate 35 is incident on the third beam splitter 36.

1.2.2.2 First Etalon. Spectrometer and Second Etalon Spectrometer

The third beam splitter 36 is provided in an optical path of the diffused light emitted from the diffusing plate 35. The third beam splitter 36 transmits a part of the diffused light emitted from the diffusing plate 35 and reflects another part.

The first etalon spectrometer 26 is provided in an optical path of the diffused light reflected by the third beam splitter 36. The second etalon spectrometer 27 is provided in an optical path of the diffused light transmitted by the third beam splitter 36. The first and second etalon spectrometers 26 and 27 detect interference fringes (shapes of fringes) generated by the diffused light incident on the respective etalon spectrometers and measure the central wavelength of the pulse laser beam. The second etalon spectrometer 27 has a higher resolving power of the interference fringe than the first etalon spectrometer 26.

The first etalon spectrometer 26 includes a first etalon 26a, a focusing lens 26b, and a line sensor 26c. The first etalon 26a is, as is well known, an optical element having two partially reflective surfaces facing each other. This serves as a wavelength filter that transmits light of a certain wavelength strengthened by multiple interferences between the partially reflective surfaces. The light transmitted by the first etalon 26a forms the interference fringe.

The first etalon 26a includes, for example, an air gap etalon having an air gap between the partially reflective surfaces. The air gap etalon includes, as is well known, two mirrors each having the partially reflective surface formed by coating a partially reflective film, spacers being inserted between the two mirrors and optically combining the two mirrors, and the air gap formed between the partially reflective surfaces of the mirrors.

Generally, interference in an etalon is expressed by Formula (1).

$$m\lambda = 2nd \cdot \cos\theta \qquad \text{Formula (1)}$$

Here, $\lambda$ is the wavelength of the laser beam, n is the refractive index of the air gap, d is the gap between the partially reflective surfaces, and m is an integer.

Variation in the angle of incidence $\theta$ of the light incident on the first etalon 26a causes variation in a difference between the optical path length of the light transmitted by the first etalon 26a without reciprocating between the two partially reflective surfaces and the optical path length of the light transmitted after reciprocating between the two partially reflective surfaces. The light incident on the first etalon 26a is transmitted by the first etalon 26a at a high transmittance if the difference between the optical path lengths is m times of the wavelength $\lambda$, where m is an integer.

If the light having the wavelength λ is incident on the first etalon 26a at the angle of incidence θ satisfying Formula (1), the light is transmitted by the etalon at a high transmittance. Accordingly, a change in the wavelength λ of the light incident on the first etalon 26a causes a change in the angle of incidence θ of the light that is transmitted at a high transmittance by the first etalon 26a.

The focusing lens 26b is provided in an optical path of the light transmitted by the first etalon 26a and converges the light transmitted by the first etalon 26a. The line sensor 26c includes, for example, two or more photodiodes as light receiving elements each outputting a detection signal obtained by photoelectric conversion according to the light intensity. The photodiodes are arranged in one-dimension to constitute a photodiode array. A detecting surface of the line sensor 26c is provided at the focal point of the focusing lens 26b. The light transmitted by the focusing lens 26b is incident on the detecting surface of the line sensor 26c and forms an image of an interference fringe on the detecting surface. The line sensor 26c detects the light intensity distribution of the interference fringe formed on the detecting surface. The second power of the radius of the interference fringe detected by the line sensor 26c is proportional to the wavelength λ of the pulse laser beam.

The line sensor 26c receives an output trigger from the wavelength controller 21. The line sensor 26c outputs, upon receiving the output trigger, the detection signal according to the light intensity distribution of the interference fringe to the wavelength controller 21. Note that, instead of the line sensor 26c, an unillustrated area sensor having unillustrated light receiving elements arranged in two-dimension may be used.

The second etalon spectrometer 27 basically has the same configuration as the first etalon spectrometer 26 and includes a second etalon 27a, a focusing lens 27b, and a line sensor 27c. The second etalon 27a includes, for example, an air gap etalon as described above with the first etalon 26a.

The focusing lens 27b is provided in an optical path of the light transmitted by the second etalon 27a and converges the transmitted light. The line sensor 27c includes, for example, a one-dimensional photodiode array. A detecting surface of the line sensor 27c is provided at the focal point of the focusing lens 27b. The light transmitted by the focusing lens 27b is incident on the detecting surface of the line sensor 27c and forms an image of an interference fringe on the detecting surface. The line sensor 27c detects the light intensity distribution of the interference fringe formed on the detecting surface.

The first etalon spectrometer 26 having a relatively low resolving power is referred to as a coarse etalon. The second etalon spectrometer 27 having a relatively high resolving power is referred to as a fine etalon. The focal length of the focusing lens 26b of the first etalon spectrometer 26 is shorter than the focal length of the focusing lens 27b of the second etalon spectrometer 27.

The free spectral range FSR of the etalon corresponding to the interval of interference fringes is expressed by Formula (2).

$$FSR=\lambda^2/(2nd) \quad \text{Formula (2)}$$

Suppose that the free spectral range FSR of the first etalon spectrometer (the coarse etalon) 26 is FSRc, and the free spectral range FSR of the second etalon spectrometer (the fine etalon) 27 is FSRf. The relationship between the free spectral ranges FSRc and FSRf satisfies a condition expressed by Formula (3).

$$FSRf<FSRc \quad \text{Formula (3)}$$

Generally, the resolving power R of the etalon is expressed by Formula (4).

$$R=FSR/F \quad \text{Formula (4)}$$

Here, F is the finesse.

Under the same finesse F, the smaller the free spectral range FSR is, the higher the resolving power R is. According to the relationship shown by Formula (3), the free spectral range FSRf of the second etalon spectrometer 27 is larger than the free spectral range FSRc of the first etalon spectrometer 26. Therefore, the second etalon spectrometer 27 has a higher resolving power R than the first etalon spectrometer 26. The second etalon spectrometer 27 is thus capable of measuring the change in the central wavelength in higher resolution than the first etalon spectrometer 26.

Generally, if a change in wavelength coincides with a multiple of the free spectral range FSR of an etalon, the interference fringe to be detected is substantially the same as that detected before the change and thus the change in wavelength may not be detected. Thus, the range of detection of the change in wavelength using the second etalon spectrometer 27 is narrow. The range of detection of the change in wavelength using the first etalon spectrometer 26 is wide. Combining the first and second etalon spectrometers 26 and 27 allows the measurement of the change in wavelength in a relatively wide range at a high accuracy.

In this example, the free spectral range FSRc of the first etalon spectrometer 26 and the free spectral range FSRf of the second etalon spectrometer 27 are as follows FSRc=400 pm, FSRf=10 pm If, for example, the change in the wavelength of the excimer laser is within approximately 400 pm, the change in the wavelength within the relatively wide range of approximately 400 pm may be measured with the first etalon spectrometer 26. The change in the wavelength within a range of approximately 10 pm may be measured with the second etalon spectrometer 27 in a high resolution.

In this example, the line sensors 26c and 27c have the same resolutions with each other. Alternatively, the resolution of the line sensor 27c may be higher than that of the line sensor 26c. It is thus possible to improve the accuracy in the detection of the interference fringe using the second etalon spectrometer 27.

1.2.2.3 First Housing

The first housing 37 accommodates the third beam splitter 36, the first etalon 26a, and the second etalon 27a. Optical elements such as the diffusing plate 35, the focusing lens 26b, and the focusing lens 27b are provided at corresponding openings formed in the wall of the first housing 37.

The air in the first housing 37 is replaced by dry nitrogen gas ($N_2$ gas) and the first housing 37 is sealed. Sealing members such as O-rings 41, 43, and 44 are provided to fill the gaps between the wall and the corresponding optical elements such as the diffusing plate 35 and the focusing lenses 26b and 27b at the corresponding openings. This causes the interior space of the first housing 37 to be a sealed chamber.

If a gas leakage happens, the gas density or the gas composition in the first housing 37 changes. This causes the refractive index n of the gas in the air gap of each of the etalons 26a and 27a in the first housing 37 to be changed. As shown by Formula (1), even if the wavelength of the light incident on the etalons 26a and 27a does not change, the change in the refractive index n causes the position of the interference fringe on the detecting surface to drift and causes the measured value of the wavelength λ to be changed. To suppress such error in the wavelength measurement, the sealing structure where the first housing 37 is sealed by the sealing member is provided.

Figure 2:
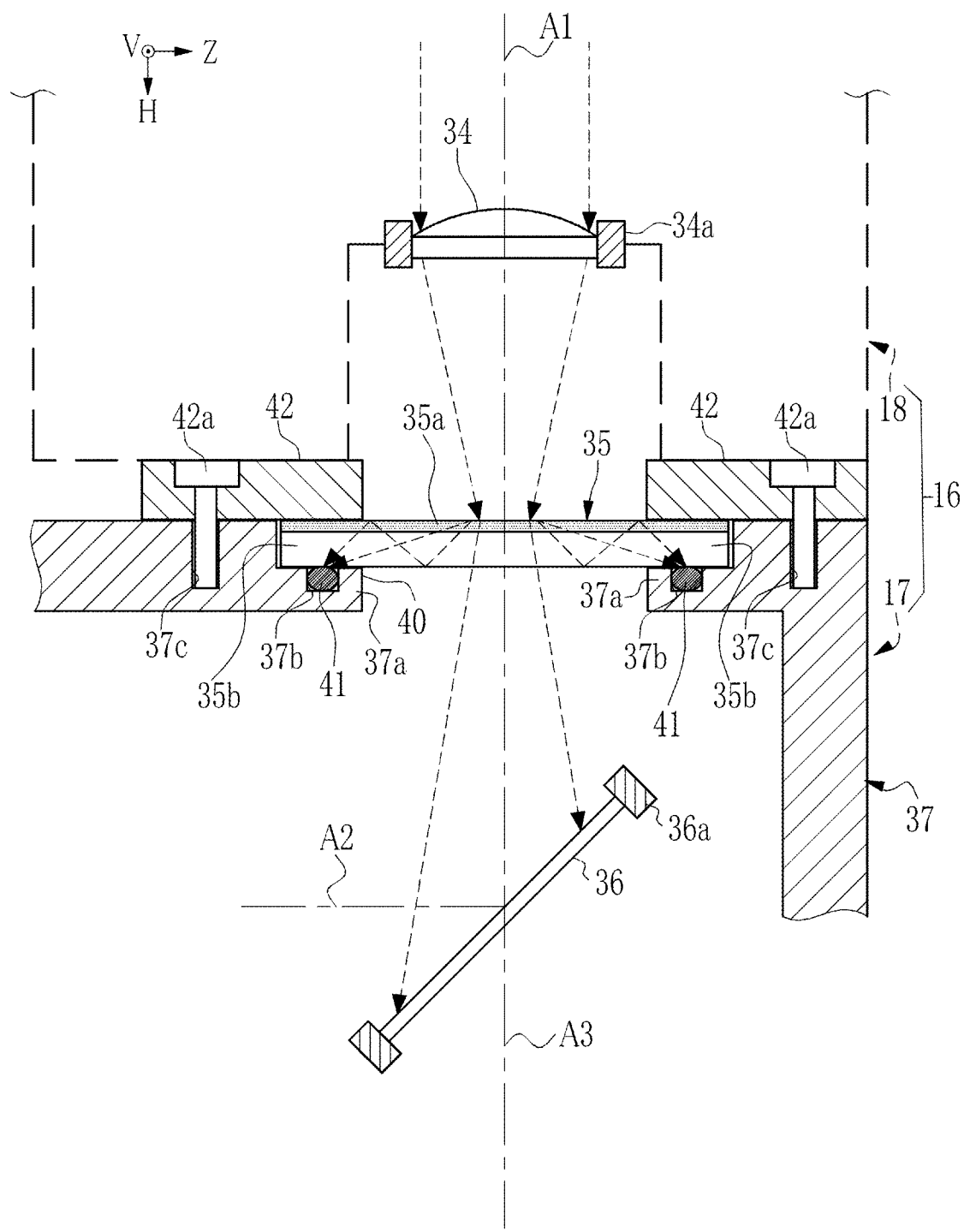
FIG. 2 is a schematic diagram that explains a problem with the comparative example.

Specifically, as shown in FIG. 2, the diffusing plate 35 is provided at an opening 40 formed in the wall of the first housing 37. The plan shape of the diffusing plate 35 is, for example, a circular shape and the plan shape of the opening 40 is also a circular shape corresponding to that of the diffusing plate 35. The gap between a circumferential portion 37a of the opening 40 and a rim part 35b of the diffusing plate 35 is sealed by the O-ring 41.

The circumferential portion 37a of the opening 40 has, for example, a flange portion projected to the center of the opening 40. The diffusing plate 35 is provided such that the surface of the rim part 35b on the same side of the surface from which the light is emitted (i.e. the surface opposite to the diffusing surface 35a) faces and contacts the surface of the flange portion of the circumferential portion 37a. The flange portion of the circumferential portion 37a has a groove 37b to accommodate the O-ring 41. Fitting the diffusing plate 35 into the opening 40 causes the rim part 35b of the diffusing plate 35 to contact the O-ring 41.

In the situation where the diffusing plate 35 is fitted into the opening 40, the diffusing plate 35 is fixed to the first housing 37 by a fixing member 42. The fixing member 42 is a ring having a circular shape and is put on the rim part 35b at the surface on the same side of the diffusing surface 35a. The fixing member 42 is fixed to the first housing 37 by bolts 42a. The first housing 37 has screw holes 37c to receive the bolts 42a. The bolts 42a cause the fixing member 42 on the surface on the same side of the diffusing surface 35a to press the diffusing plate 35 to the flange portion. The pressing force elastically deforms the O-ring 41 to seal the gap between the rim part 35b of the diffusing plate 35 and the circumferential portion 37a of the opening 40.

The O-ring 41 is made of an elastic resin such as fluorine-based rubber. The first housing 37 is made of a metal such as aluminum.

The O-rings 43 and 44 (see FIG. 1) attached to the focusing lenses 26b and 27b and their attachment structures are substantially the same as the O-ring 41 attached to the diffusing plate 35. Detailed description thereof is thus omitted.

In FIG. 2, the reference symbol 34a shows a holder to hold the focusing lens 34 and the reference symbol 36a shows a holder to hold the third beam splitter 36. The reference symbol A1 shows an optical path axis of the light incident on the focusing lens 34, the diffusing plate 35, and the third beam splitter 36. The reference symbol A2 shows an optical path axis of the light reflected by the third beam splitter 36 and incident on the first etalon 26a. The reference symbol A3 shows an optical path axis of the light transmitted by the third beam splitter 36 and incident on the second etalon 27a.

As shown in FIG. 1, the sensor housing 38 accommodates the line sensor 26c. The sensor housing 38 holds the line sensor 26c such that the detecting surface of the line sensor 26c faces the focusing lens 26b and the detecting surface of the line sensor 26c coincides with the focal point of the focusing lens 26b. The sensor housing 38 is a bottomed cylindrical member having an opening at which the focusing lens 26b is provided and being fixed to the first housing 37. The sensor housing 39 has substantially the same configuration as the sensor housing 38, holding the line sensor 27c and being fixed to the first housing 37.

1.3 Exposure Apparatus

The exposure apparatus 4 includes an exposure apparatus controller 4a. The exposure apparatus controller 4a performs various controls such as the moving of an unillustrated wafer stage. The exposure apparatus controller 4a sends, to the laser controller 20, data of a target value $\lambda_T$ of central wavelength, data of a target value $E_T$ of pulse energy, and the oscillation trigger signal. The data of the target value $\lambda_T$ of central wavelength is inputted to the laser controller 20 for each pulse in synchronization with the oscillation trigger signal.

1.4 Laser Controller

The laser controller 20 receives the data of the target value $\lambda_T$ of central wavelength from the exposure apparatus controller 4a and sends it to the wavelength controller 21. The laser controller 20 receives the data of the target value $E_T$ of pulse energy from the exposure apparatus controller 4a and receives the data on the pulse energy from the energy sensor 33. The laser controller 20 then controls the setting value of the charging voltage of the electric power source 12. The control of the setting value of the charging voltage of the electric power source 12 causes the pulse energy of each pulse of the pulse laser beam to be controlled.

The laser controller 20 receives the oscillation trigger signal from the exposure apparatus controller 4a and outputs the oscillation trigger signal to the switch 12a included in the electric power source 12.

1.5 Wavelength Controller

The wavelength controller 2:1 receives the detection signal from the energy sensor 33. The wavelength controller 21 then outputs the output trigger to both of the line sensors 26c and 27c of the respective first and second etalon spectrometers 26 and 27. Upon receiving the output trigger, each of the line sensors 26c and 27c outputs the detection signal representing the light intensity distribution of the interference fringe to the wavelength controller 21. The wavelength controller 21 acquires the detection signal from each of the line sensors 26c and 27c and calculates the central wavelength $\lambda$ of each pulse of the pulse laser beam.

The second power of the radius of an interference fringe detected by each of the line sensors 26c and 27c is proportional to the central wavelength $\lambda$ of the pulse laser beam. The wavelength controller 21 calculates the radius of the interference fringe generated by the first etalon spectrometer 26 based on the interference fringe detected by the line sensor 26c. The wavelength controller 21 also calculates the radius of the interference fringe generated by the second etalon spectrometer 27 based on the interference fringe detected by the line sensor 27c. Based on the second power of each of the radius and the proportional relationship described above, the central wavelength $\lambda$ of the pulse laser beam is calculated.

The wavelength controller 21 calculates the difference $\Delta\lambda$ between the calculated central wavelength $\lambda$ and the target value $\lambda_T$ of central wavelength received from the laser controller 20. The wavelength controller 21 controls, based on the difference $\Delta\lambda$, the rotary stage 14d to rotate the prism 14b such that the calculated central wavelength $\lambda$ approaches the target value $\lambda_T$ of central wavelength. The wavelength controller 21 controls the rotary stage 14d by sending a control signal to the driver 23.

1.6 Operation

The laser controller 20 receives the data of the target value $E_T$ of pulse energy and the target value $\lambda_T$ of central wavelength from the exposure apparatus 4. The laser controller 20 controls the setting value of the charging voltage of the electric power source 12 such that the pulse energy approaches the target value $E_T$ of pulse energy. The laser controller 20 sends the data of the target value $\lambda_T$ of central wavelength to the wavelength controller 21.

The laser controller 20 turns on the switch 12a of the electric power source 12 based on the oscillation trigger signal received from the exposure apparatus 4. Upon the switch 12a is turned on, a high voltage is applied across the discharge electrodes 11a and 11b to cause an electric discharge, which excites the laser medium. When the laser medium is excited, light is generated and reciprocates between the line narrow module 14 and the output coupling mirror 15. The light is thus amplified in the electric discharge space, causing laser oscillation. Thus, the pulse laser beam having the narrowed spectral width is outputted via the output coupling mirror 15.

The pulse laser beam incident on the first beam splitter 31 is transmitted by the first beam splitter 31 and outputted to the exposure apparatus 4. However, a part of the pulse laser beam is reflected by the first beam splitter 31 as a sampled pulse laser beam.

The sampled pulse laser beam sampled by the first beam splitter 31 is incident on the second beam splitter 32. A part of the sampled pulse laser beam incident on the second beam splitter 32 is reflected by the second beam splitter 32 and incident on the energy sensor 33. The laser controller 20 controls, based on the data on the pulse energy received from the energy sensor 33, the pulse energy of the pulse laser beam to approach the target value $E_T$ of pulse energy.

Another part of the sampled pulse laser beam is transmitted by the second beam splitter 32 and incident on the focusing lens 34. The focusing lens 34 converges the light. The light converged by the focusing lens 34 is incident on the diffusing plate 35. The light incident on the diffusing plate 35 is scattered as the diffused light. The diffused light is, via the third beam splitter 36, incident on each of the first and second etalon spectrometers 26 and 27. Each of the first and second etalon spectrometers 26 and 27 detects the interference fringe having the radius according to the wavelength $\lambda$ of the light.

The wavelength controller 21 receives, from each of the respective line sensors 26c and 27c of the first and second etalon spectrometers 26 and 27, the detection signal of the interference fringe detected for each pulse of the pulse laser beam. The wavelength controller 21 calculates, based on the detection signal, the central wavelength $\lambda$ of the pulse laser beam for each pulse. The wavelength controller 21 controls the rotary stage 14d to rotate the prism 14b such that the calculated central wavelength $\lambda$ approaches the target value $\lambda_T$ of central wavelength.

As described above, the pulse energy and the wavelength of the pulse laser beam outputted from the laser resonator is adjusted to the target value $E_T$ of pulse energy and the target value $\lambda_T$ of central wavelength, respectively, demanded by the exposure apparatus 4. Since the interior space of the first housing 37 is a sealed chamber, the gas density and the gas composition in the interior space are stable. Accordingly, the change in the refractive index n of the air gap of each of the first and second etalons 26a and 27a is suppressed and the error in the wavelength measurement due to the drifting of the position of the interference fringe is reduced.

2. Problem

As shown in FIG. 2, the pulse laser beam incident on the diffusing plate 35 is scattered by the diffusing surface 35a and emitted as the diffused light. The light scattered by the diffusing surface 35a travels not only to the third beam splitter 36. A part of the light scattered by the diffusing surface 35a travels to the rim part 35b of the diffusing plate 35 to be incident on the O-ring 41 facing the rim part 35b. The path of the light incident on the O-ring 41 includes a path starting from the diffusing surface 35a and traveling directly to the O-ring 41 facing the rim part 35b. The path of the light incident on the O-ring 41 also includes a path starting from the diffusing surface 35a, repeating a total reflection in the diffusing plate 35, and reaching the O-ring 41 facing the rim part 35b.

The O-ring 41, which is made of an elastic resin such as rubber, is deteriorated by being irradiated with the pulse laser beam of ultraviolet light. Even if the O-ring 41 is made of fluorine-based rubber, it may be hardened by losing a double bond by being irradiated with the pulse laser beam. The deterioration of the O-ring 41 generates a crack, loses elasticity, and causes the seal of the first housing 37 to be broken. Breakage of the seal of the first housing 37 causes the change in gas density by the gas leakage and causes the change in gas composition by outside air. The change in gas density caused by the gas leakage and the change in gas composition caused by outside air cause a change in the refractive index n of the air gap of each of the first and second etalons 26a and 27a. As described above, even if there is no change in the wavelength $\lambda$ of the pulse laser beam incident on each of the first and second etalon spectrometers 26 and 27, the change in the refractive index n of the air gap causes the position of the interference fringe to drift in each of the etalon spectrometers 26 and 27, worsening the measuring accuracy.

Further, if the seal of the first housing 37 is broken and outside air including impurities flows in the first housing 37, the impurities may be decomposed by the pulse laser beam. The decomposition products may adhere to optical elements such as the first and second etalons 26a and 27a and the third beam splitter 36, causing them to be fogged, and change the transmittance.

To prevent the gas leakage caused by the deterioration of the O-ring 41, it is necessary to periodically replace the O-ring 41. During the replacement of the O-ring 41, the seal of the first housing 37 is broken and the interior space is open to the outside.

However, if the seal is once broken, re-sealing of the first housing 37 is considerably time-consuming work.

This is explained as follows. At the time of sealing the first housing 37, it is not only simply required to perform gas replacement of the air in the first housing 37 with dry nitrogen gas. It is considerably time-consuming to perform a post-processing or to stabilize the gas density in the first housing 37.

For example, in spite of the gas replacement, water or the like may be adsorbed to the inner surface of the first housing 37 or the partially reflective film of the etalon. For some period after performing the sealing, the adsorbed water may be vaporized as outgas to be mixed with the dry nitrogen gas. If the amount of the vaporized water is large, the partially reflective film of the etalon may absorb the water again. The water absorbed by the partially reflective film of the etalon causes a change in the reflectance for the pulse laser beam and a change in the resolving power of the etalon.

Further, in the case where the inner surface of the first housing 37 has a plating layer, the plating layer generates outgas of organic matter or the like other than water to be mixed with the dry nitrogen gas. For some period after performing the gas replacement, the change of outgassing in the first housing 37 causes the gas density and the gas composition to be unstable. Unstable gas density causes the refractive index n of the air gap to be changed and reduces the accuracy in measuring the wavelength of the pulse laser beam. Accordingly, until the gas density and the gas composition become stable, the line narrowed laser apparatus 2 may not be operated.

The O-ring 41 is one of expendable parts that are deteriorated as time passes. Thus, even if the O-ring 41 is not irradiated with the pulse laser beam, periodic replacement of the O-ring 41 is necessary. However, as described above, the replacement of the O-ring 41 includes the opening and closing of the first housing 37, taking time and effort. Frequent replacement of the O-ring 41 causes reduction of the operation rate of the line narrowed laser apparatus 2.

Further, the focusing lens 34 provided upstream from the diffusing plate 35 is irradiated with the sampled pulse laser beam immediately after being outputted from the laser resonator. The sampled pulse laser beam has a considerably high intensity. The pulse laser beam incident on the focusing lens 34 is converged and incident on the diffusing plate 35. Thus, the pulse laser beam incident on the diffusing plate 35 has a considerably high light intensity and the deterioration of the diffusing plate 35 is rapid as compared to the other expendable parts. Replacement of the diffusing plate 35 also includes the opening and closing of the first housing 37 as with the replacement of the O-ring 41. The problem in the replacement of the diffusing plate 35 is substantially the same as that of the O-ring 41.

Accordingly, efforts have been made to find measures to extend the period of using the O-ring 41 and the diffusing plate 35, which are expendable parts, with the first housing 37 kept sealed.

To solve this problem, an embodiment described below provides a wavelength measuring device including, an input window provided at a first opening formed in the wall of a first housing such that the ultraviolet laser light enters to the first housing through the input window, a first sealing member configured to seal the gap between a rim part of the input window and the circumferential portion of the first opening, a shielding film provided between the rim part of the input window and the sealing member and configured to shield the sealing member from the ultraviolet laser light coming from the input window, and a diffusing element provided outside of the first housing and upstream from the input window, the diffusing element being configured to diffuse the ultraviolet laser light.

Figure 3:
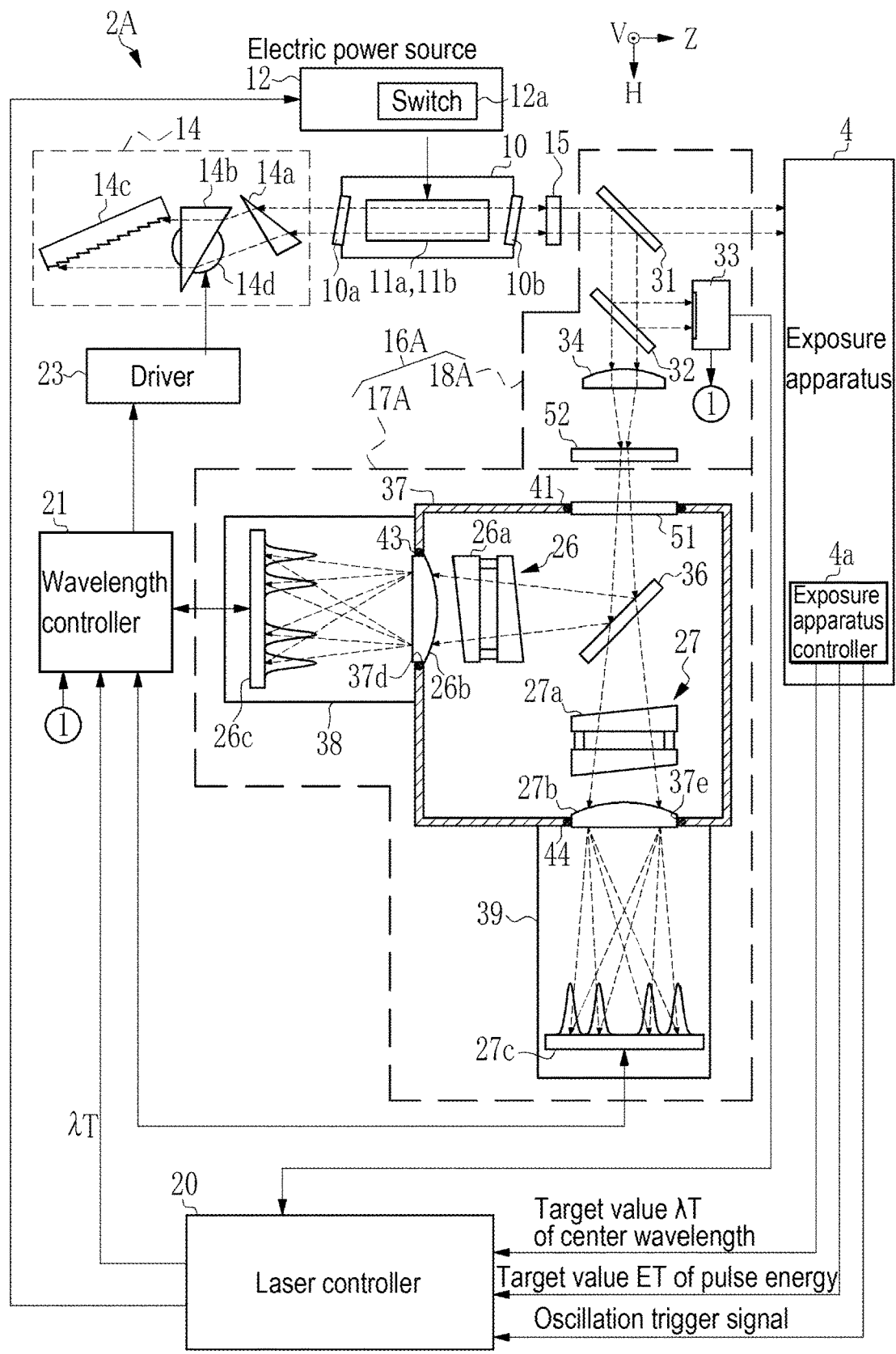
FIG. 3 schematically shows a configuration of a line narrowed laser apparatus that uses a wavelength measuring device of a first embodiment.

3. Line Narrowed Laser Apparatus Using Wavelength Measuring Device According to First Embodiment 3.1 Configuration FIG. 3 schematically shows a configuration of a line narrowed laser apparatus 2A using a wavelength measuring device according to a first embodiment. The line narrowed laser apparatus 2A is different from the line narrowed laser apparatus 2 described above with reference to FIG. 1 at the point that the line narrowed laser apparatus 2A includes a monitoring module 16A instead of the monitoring module 16. The line narrow module 14, the laser resonator, the laser controller 20, and the wavelength controller 21 have substantially the same configurations as those described with the same reference symbols for the line narrowed laser apparatus 2. Description thereof is thus omitted.

In FIG. 3, the monitoring module 16A includes a first unit 17A and a second unit 18A. The first unit 17A is different from the first unit 17 shown in FIG. 1 at the point that the first unit 17A includes, instead of the diffusing plate 35, an input window 51 through which the pulse laser beam enters to the first housing 37. In the first unit 17A, elements other than the input window 51 such as the first housing 37, the third beam splitter 36, the first and second etalon spectrometers 26 and 27, and the O-ring 41 have substantially the same configurations as those described with the same reference symbols for the first unit 17 shown in FIG. 1. Description thereof is thus omitted.

The second unit 18A is different from the second unit 18 shown in FIG. 1 at the point that the second unit 18A includes a diffusing plate 52. Elements other than the diffusing plate 52 such as the first beam splitter 31, the second beam splitter 32, the energy sensor 33, and the focusing lens 34 have substantially the same configurations as those described with the same reference symbols for the second unit 18 shown in FIG. 1. Description thereof is thus omitted.

Figure 4:
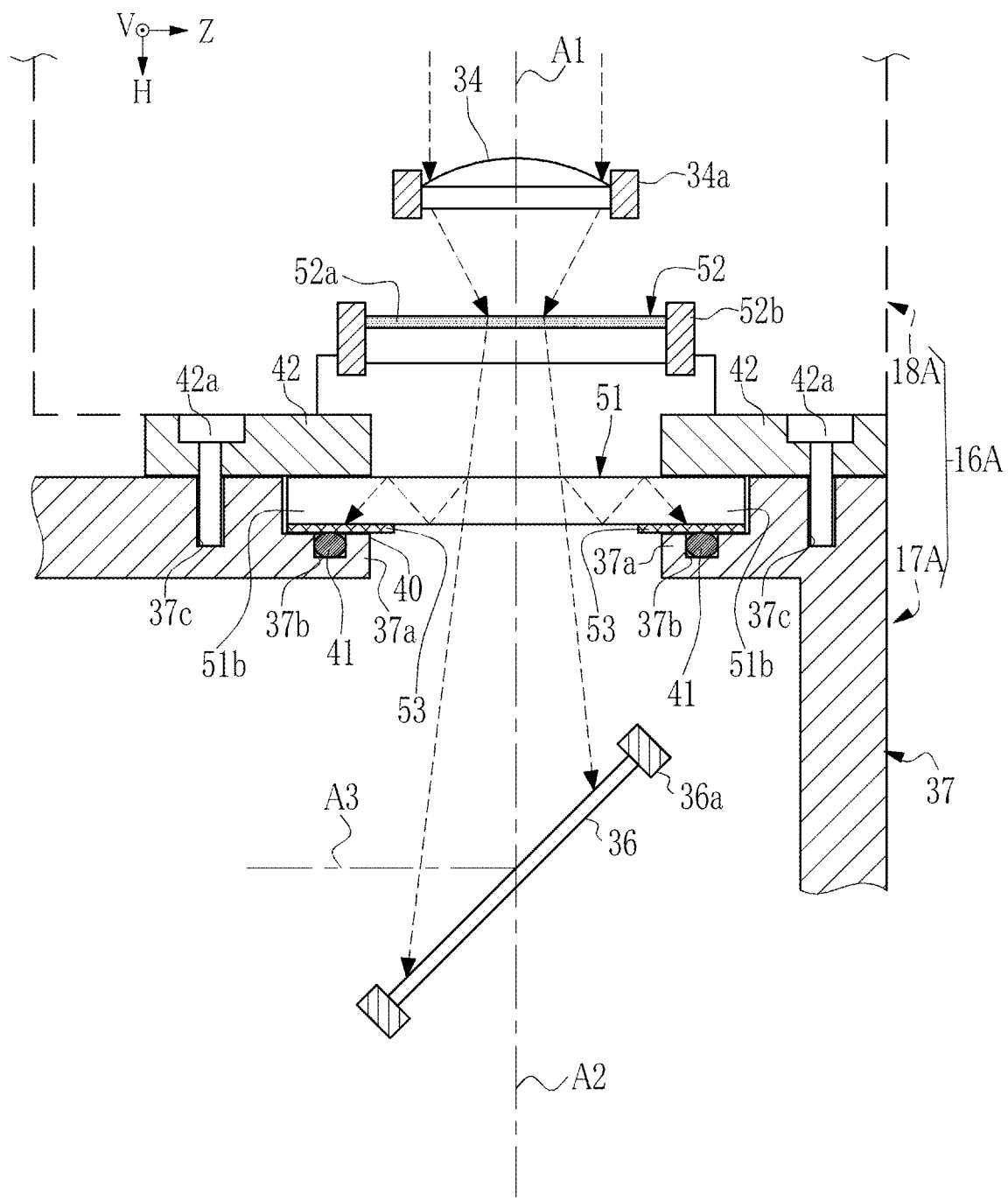
FIG. 4 shows a part of the wavelength measuring device of the first embodiment.

As shown in FIG. 4, the input window 51 is a plane-parallel plate made of a material that transmits the pulse laser beam. Unlike the diffusing plate 35 shown in FIG. 1, the input window 51 has a first surface on which the pulse laser beam is incident and a second surface from which the pulse laser beam is emitted that are both polished smooth surfaces. The plan shape of the input window 51 is a circular shape corresponding to that of the opening 40 and is fitted into the opening 40. The opening 40 corresponds to a first opening. The second surface of the input window 51 faces, at a rim part 51b of the input window 51, the circumferential portion 37a of the opening 40.

The gap between the rim part 51b and the circumferential portion 37a is sealed by the O-ring 41. The O-ring 41 corresponds to a first sealing member. The O-ring 41 is, as described above, made of an elastic resin such as fluorine-based rubber.

The input window 51 is made of, for example, synthetic quartz. Alternatively, the input window 51 may be made of $CaF_2$ (calcium fluoride). $CaF_2$ has, however, a crystal structure. If a strong pressing force is applied from the O-ring 41 or the circumferential portion 37a, $CaF_2$ may easily be damaged as compared to synthetic quartz. Accordingly, synthetic quartz is more preferable because of its high tolerance to a pressing force.

A shielding film 53 is provided and coated on the rim part 51b of the input window 51. The shielding film 53 is arranged between the rim part 51b and the O-ring 41. The shielding film 53 shields the O-ring 41 from the pulse laser beam coming from the input window 51. Since the input window 51 does not have a diffusing surface, as compared to the situation where the diffusing plate 35 shown in FIG. 1 is provided, little part of the light incident on around the center of the input window 51 scatters directly to the rim part 51b. However, some part of the light travels to the rim part 51b by repeating total reflection in the input window 51. The shielding film 53 thus covers the O-ring 41 and suppresses irradiation of the O-ring 41 with the light traveling to the rim part 51b.

The material of the shielding film 53 is, for example, aluminum to function as a reflective film to reflect ultraviolet light. Alternatively, the shielding film 53 may be an absorbing film to absorb ultraviolet light to shield the O-ring 41. However, an absorbing film is heated and causes a temperature change in the first housing 37. Accordingly, the absorbing film is less preferable in the stability of accuracy in the wavelength measurement. The reflective film such as aluminum is more preferable as the shielding film 53. The reflective film does not necessarily have a reflectance of substantially 100%. The reflective film includes a film whose reflectance is higher than the absorptance for ultraviolet light.

Aluminum is a relatively soft metal and its surface is easily worn. Shavings may thus be generated by contacting the circumferential portion 37a or the O-ring 41. The shavings may adhere to the surface of the O-ring 41 to cause sealing failure.

Figure 5:
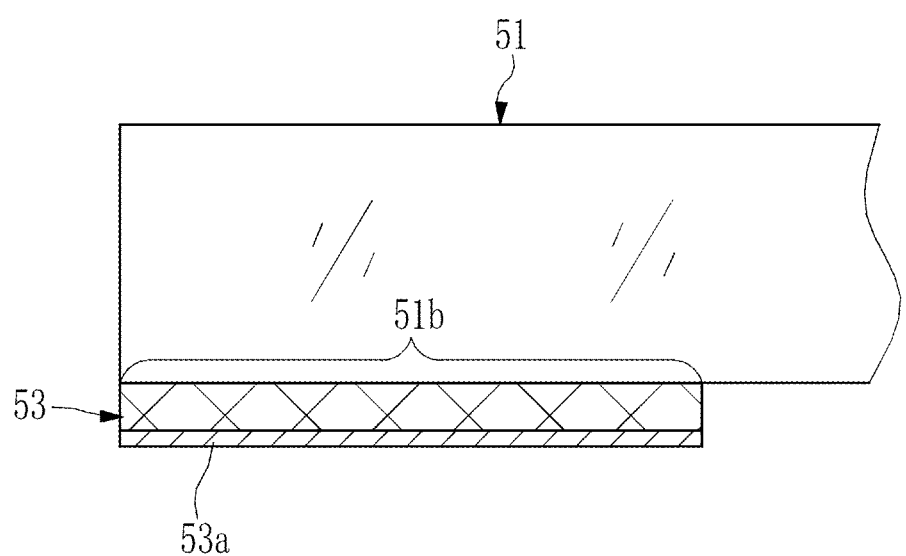
FIG. 5 is a schematic diagram of a shielding film and a protective film of an input window.

It is thus preferable, as shown in FIG. 5, to improve wear resistance, to provide a protective film 53a on the surface of the shielding film 53 contacting the O-ring 41. Preferably, the protective film 53a is, for example, a dense film of $SiO_2$ (silicon oxide) or $MgF_2$ (magnesium fluoride), having a low absorptance for ultraviolet light. The shielding film 53 or the protective film 53a is formed, for example, by depositing the material on the rim part Sib of the input window 51.

Further, the interior of the first housing 37 is, similarly to the first housing 37 shown in FIG. 1, filled with an inert gas such as dry nitrogen gas. The pressure of the interior space is set, for example, in a range from 1.2 atm to 1.4 atm, which is higher than the atmospheric pressure of the exterior of the first housing 37. This is to suppress entering of outside air to the first housing 37, even if the gas leakage happens due to deterioration of the O-ring 41. As the entering of the outside air including impurities is suppressed, decomposing of the impurities in the first housing 37 by the pulse laser beam is suppressed and adhering of the decomposition products on the surface of the optical elements is also suppressed.

As shown in FIG. 4, the diffusing plate 52 in the second unit 18A is, similarly to the diffusing plate 35 shown in FIG. 1, a plane-parallel plate made of a material that transmits the pulse laser beam. A diffusing surface 52a is formed by a roughening process such as a frosting process on at least one surface of the diffusing plate 52. The reference symbol 52b shows a holder of the diffusing plate 52. The diffusing plate 52 is provided downstream from the focusing lens 34. The diffusing plate 52 corresponds to a diffusing element provided upstream from the input window 51 and configured to diffuse the pulse laser beam converged by the focusing lens 34. The diffused light emitted from the diffusing plate 52 is incident on the input window 51.

The diffusing plate 52 is arranged at a position shifted from the focal point of the focusing lens 34. If the diffusing plate 52 is arranged at the focal point of the focusing lens 34, the pulse laser beam having a considerably high intensity is incident on the diffusing plate 52 and the diffusing plate 52 tends to be deteriorated. This is the reason why the diffusing plate 52 is arranged at a position shifted from the focal point of the focusing lens 34. Deterioration of the diffusing plate 52 is thus suppressed. The diffusing plate 52 is positioned, for example, upstream from the focal point of the focusing lens 34, such that the irradiated region of the diffusing plate 52 irradiated with the pulse laser beam transmitted by the focusing lens 34 is included in an effective region of the diffusing plate 52.

The gap between the diffusing plate 52 and the input window 51 is, for example, approximately 10 mm. Too large gap between the diffusing plate 52 and the input window 51 is not preferable since the diffused light from the diffusing plate 52 diffuses over the effective diameter of the input window 51. Accordingly, the gap between the diffusing plate 52 and the input window 51 is set such that the diffused light diffuses within the effective diameter of the input window 51.

As described above, the first housing 37 accommodates the focusing lens 26b that converges the light transmitted by the first etalon 26a and the focusing lens 27b that converges the light transmitted by the second etalon 27a. The focusing lenses 26b and 27b function as output windows to output light to the outside of the first housing 37.

As shown in FIG. 3, the line sensor 26c corresponds to a first image sensor provided outside of the first housing 37 and configured to photograph first transmitted light transmitted by the first etalon 26a. The focusing lens 26b corresponds to a first output window provided in an opening 37d corresponding to a second opening formed in the wall of the first housing 37 and configured to converge the first transmitted light on the line sensor 26c. The line sensor 27c corresponds to a second image sensor provided outside of the first housing 37 and configured to photograph the second transmitted light transmitted by the second etalon 27a. The focusing lens 27b corresponds to a second output window provided in an opening 37e corresponding to a third opening formed in the wall of the first housing 37 and configured to converge the second transmitted light on the line sensor 27c.

Similarly to the configurations of the input window 51, the opening 40 and the O-ring 41, the gap between the rim part of the focusing lens 26b and the circumferential portion of the opening 37d is sealed by the O-ring 43. The O-ring 43 corresponds to a second sealing member. Similarly, the gap between the rim part of the focusing lens 27b and the circumferential portion of the opening 37e is sealed by the O-ring 44. The O-ring 44 corresponds to a third sealing member.

The shielding film 53 provided on the rim part 51b of the input window 5i is not provided on the rim part of any of the focusing lenses 26b and 27b. This is explained as follows. The light incident on the focusing lenses 26b and 27b is the light transmitted by the first and second etalons 26a and 27a, respectively, and has a low light intensity as compared to the light incident on the input window 51. Thus, even if the light incident on the focusing lenses 26b and 27b travels to the rim part thereof, little deterioration of the O-rings 43 and 44 occurs by being irradiated with the light.

3.2 Operation

The pulse laser beam outputted from the output coupling mirror 15 is transmitted by the first beam splitter 31 at a high transmittance and outputted to the exposure apparatus 4. The first beam splitter 31 reflects as a sample a part of the pulse laser beam incident on the first beam splitter 31.

A part of the pulse laser beam sampled by the first beam splitter 31 is transmitted by the second beam splitter 32 and incident on the focusing lens 34. The light converged by the focusing lens 34 is incident on the diffusing plate 52. The light incident on the diffusing plate 52 is scattered as the diffused light. The diffused light is then incident on the input window 51 to enter to the first housing 37. The scattered light transmitted by the input window 51 is, via the third beam splitter 36, incident on the first and second etalon spectrometers 26 and 27. Each of the first and second etalon spectrometers 26 and 27 detects the interference fringe having the radius according to the wavelength h of the light incident thereon. The wavelength controller 21 controls the central wavelength λ based on the detection signal outputted from the first and second etalon spectrometers 26 and 27.

3.3 Effect

The rim part 51b of the input window 51 of the first housing 37 has the shielding film 53. Even if a part of the light incident on the input window 51 travels toward the rim part 51b, most of the light is reflected by the shielding film 53. Irradiation of the O-ring 41 with the pulse laser beam of ultraviolet light is thus suppressed and deterioration of the O-ring 41 is suppressed. Since the deterioration of the O-ring 41 is suppressed, the effective life of the O-ring 41 is extended. Accordingly, as compared to the comparative example without the shielding film the period of use with the first housing 37 kept sealed can be extended.

Since the deterioration of the O-ring 41 is suppressed due to the shielding film 53, the gas leakage is also suppressed and the change in the refractive index n of the air gap of each of the first and second etalons 26a and 27a is also suppressed. This allows the accuracy in the wavelength measurement to be stable for a long time.

In the first embodiment, the diffusing plate 52 separated from the input window 51 attached to the first housing 37 is provided outside of the first housing 37. Accordingly, even if the diffusing plate 52 is deteriorated, the diffusing plate 52 can be replaced without breaking the seal of the first housing 37. Consequently, as compared to the comparative example where the seal of the first housing 37 needs to be broken at every time of replacing the diffusing plate 35, the period of use with the first housing 37 kept sealed can be extended.

Further, the diffusing plate 52 diffuses the pulse laser beam at the position upstream from the input window 51. Accordingly, diffused light whose light intensity is reduced is incident on the input window 51 and the deterioration of the input window 51 is suppressed. Since the effective life of the input window 51 is extended, the frequency of replacement of the input window 51 is reduced. Thus, the period of use with the first housing 37 kept sealed can be extended.

4. Wavelength Measuring Device According to Second Embodiment 4.1 Configuration

Figure 6:
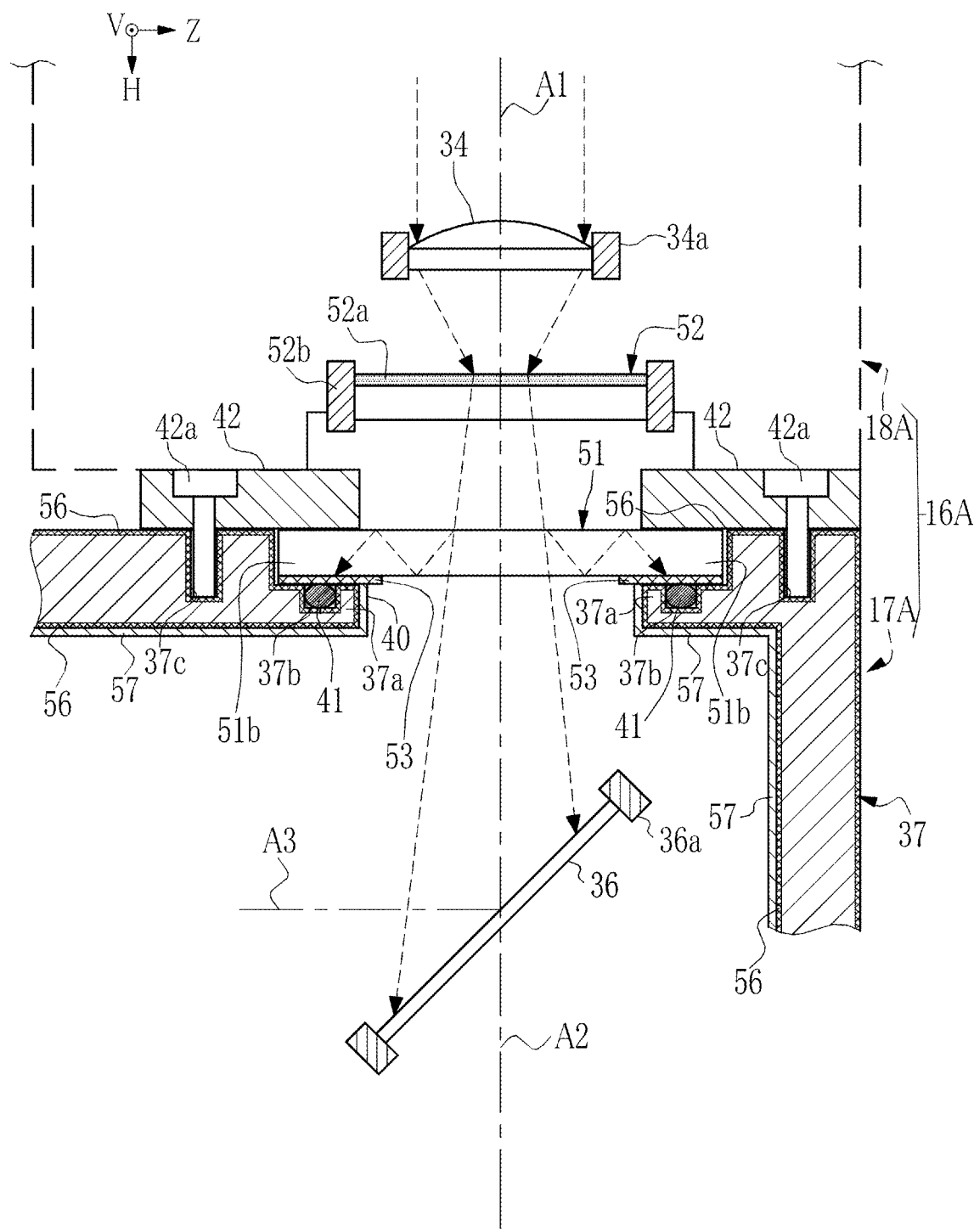
FIG. 6 shows a part of a wavelength measuring device of a second embodiment.

FIG. 6 shows a wavelength measuring device according to a second embodiment, which has substantially the same configurations as the first embodiment shown in FIG. 4. The difference from the first embodiment is as follows. In the second embodiment, the first housing 37 made of aluminum has a nickel plating layer 56 on its inner and outer surfaces. Further, on the inner surface of the first housing 37, a cover member 57 covering the nickel plating layer 56 is provided. The nickel plating layer 56 is formed, for example, by a non-electrolytic nickel plating process. A non-electrolytic nickel plating process achieves a uniform film thickness and is capable of being applied to a complex form. The cover member 57 is made of aluminum or stainless steel. No surface treatment such as nickel plating is made for the cover member 57.

4.2 Effect

The surface of the first housing 37 made of aluminum is relatively soft. It is thus preferable that a surface treatment is made by the nickel plating on the screw hole 37c or the groove 37b accommodating the O-ring 41. The nickel plating improves the wear resistance, suppresses wearing that generates shavings, and suppresses wearing of the groove 37b that causes sealing failure. As described above, the shavings may adhere to the O-ring 41 to cause the sealing failure and the shavings are not preferable to be generated in the first housing 37 such as the groove 37b. The sealing failure causes the gas leakage and makes the accuracy in the wavelength measurement unstable. The nickel plating solves such a problem.

The nickel plating layer 56 has the advantage as described above. However, if the nickel plating layer 56 is irradiated with the pulse laser beam of ultraviolet light, impurities such as organic matter included in the nickel plating layer 56 may be vaporized as outgas, causing optical elements to be fogged. If the optical elements in the first housing 37 such as the third beam splitter 36 and the first and second etalons 26a and 27a are fogged, cleaning or replacing of the optical elements becomes necessary and the maintenance interval is shortened.

To keep the seal of the first housing 37 for a long time, it is preferable that the generation of outgas is suppressed. Thus, on the inner surface of the first housing 37, the cover member 57 is provided to cover the nickel plating layer 56. This prevents the pulse laser beam from being incident on the nickel plating layer 56. It is thus possible to keep the advantage of the nickel plating layer 56, to suppress generation of outgas caused by impurities such as organic matters included in the nickel plating layer 56, and to keep the seal of the first housing 37 for a long time.

4.3 Modified Example

On the same point of view as the above, it is preferable that the other holders or the like in the first housing 37 are made of aluminum or stainless steel without the nickel plating layer. Such holders may include the holder 36a for the third beam splitter 36, a holder for the first etalon 26a, and a holder for the second etalon 27a.

5. Wavelength Measuring Device According to Third Embodiment 5.1 Configuration

Figure 7:
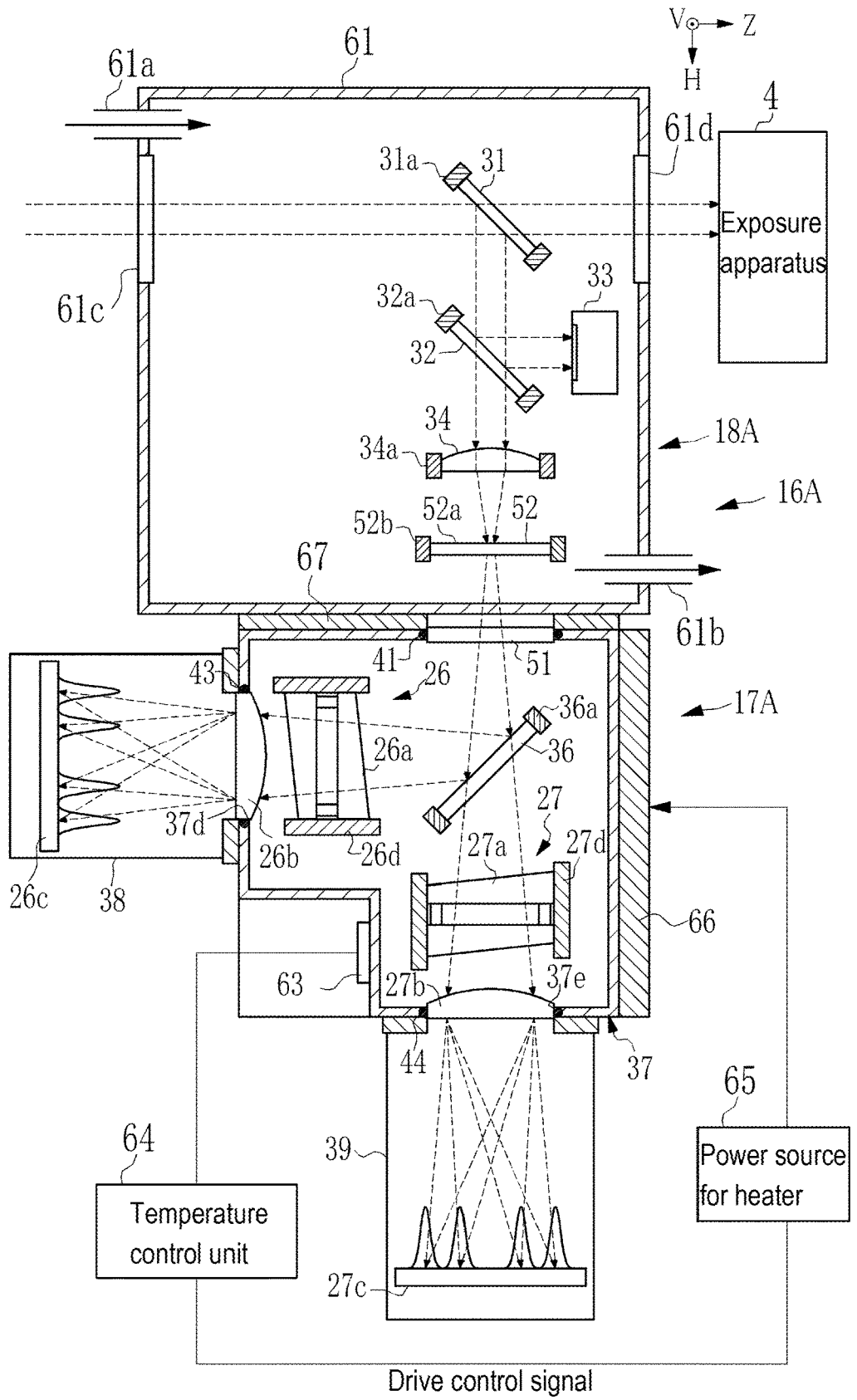
FIG. 7 schematically shows a configuration of a wavelength measuring device of a third embodiment.

FIG. 7 shows a wavelength measuring device according to a third embodiment. The main difference from the second embodiment shown in FIG. 6 is that a temperature control system is provided to control the temperature in the first housing 37. The temperature control system includes a temperature sensor 63, a temperature control unit 64, a power source 65 for heater, and a heater 66. The second unit 18A includes a second housing 61 that accommodates the first beam splitter 31, the second beam splitter 32, the energy sensor 33, the focusing lens 34, and the diffusing plate 52.

In the second housing 61, inert gas regularly flows during the operation of the laser apparatus. The inert gas is, for example, dry nitrogen gas. The inert gas may also be helium gas. However, the dry nitrogen gas is preferable in view of the costs. The second housing 61 has an intake port 61a to draw the inert gas into the second housing 61 from the exterior thereof and an emission port 61b to emit the inert gas from the second housing 61 to the exterior thereof.

The second housing 61 has an input window 61c through which the pulse laser beam from the output coupling mirror 15 is inputted and an output window 61d through which the pulse laser beam transmitted by the first beam splitter 31 is outputted to the exposure apparatus 4. The reference symbols 31a, 32a, and 34a show holders for the first beam splitter 31, the second beam splitter 32, and the focusing lens 34, respectively. In the first unit 17A, the reference symbol 26d shows a holder for the first etalon 26a and the reference symbol 27d shows a holder for the second etalon 27a.

The input window 61c or the output window 61d is not necessary, for example, in the following situation. The situation is that, in the second housing 61, an input optical path of the pulse laser beam inputted to the second housing 61 and an output optical path of the pulse laser beam outputted from the second housing 61 are each configured by an optical path tube and each optical path tube is filled with purge gas.

The first unit 17A includes the temperature sensor 63 in the first housing 37 to measure the temperature in the first housing 37. The temperature sensor 63 is arranged, for example, in the vicinity of the second etalon 27a. The reason for this arrangement is as follows. The second etalon 27a having a relatively high resolving power tends to be influenced by the temperature change as compared to the first etalon 26a. It is thus preferable to control the temperature based on the temperature in the vicinity of the second etalon 27a.

The temperature sensor 63 outputs the measured temperature to the temperature control unit 64. The temperature control unit 64 refers to a target temperature that is set in advance and the temperature measured by the temperature sensor 63. The temperature control unit 64 then controls the drive of the heater 66 such that the temperature in the first housing 37 approaches the target temperature. The target temperature is, for example, in a range of approximately 28° C.±10.1° C. The drive of the heater 66 is performed using the power source 65.

Figure 8:
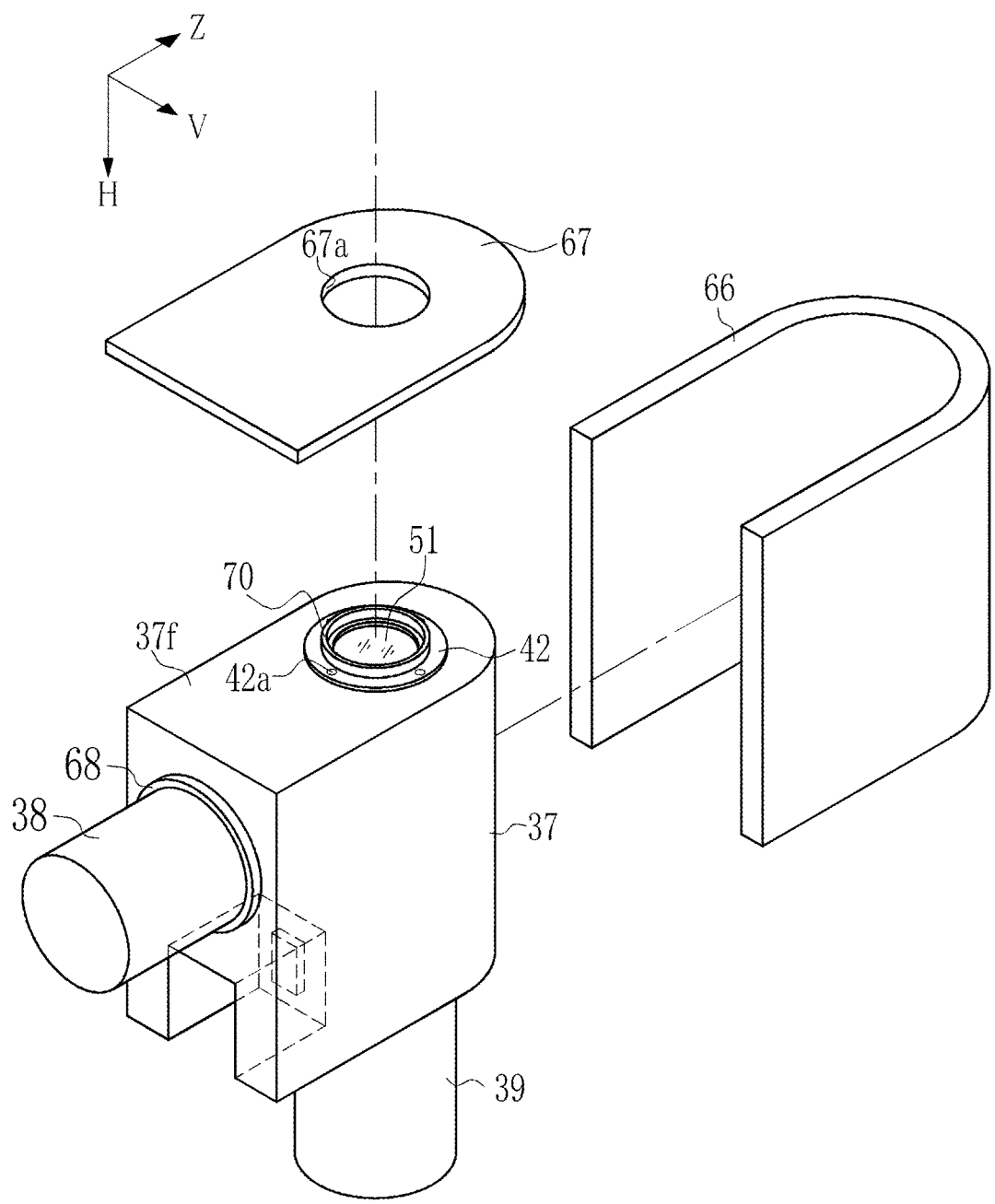
FIG. 8 shows a perspective view of an external appearance of a first unit in the third embodiment.

As shown in FIG. 8, the heater 66 is a flexible rubber heater. The heater 66 is arranged on the outer circumferential surface of the first housing 37. Specifically, the heater 66 is arranged on the right and left side faces and on the back face of the first housing 37. By covering throughout the side and back faces of the first housing 37 by the rubber heater, the rubber heater also functions as a heat insulator. Further, a heat insulator 67 is provided on a top face 37f of the first housing 37. Also, a heat insulator 68 is provided at a connecting portion where each of the sensor housings 38 and 39 is connected to the first housing 37.

The heat insulator 67 is provided for suppressing heat transmission between the first housing 37 and the second housing 61 and suppressing the temperature change in the first housing 37. The heat insulator 68 is provided for suppressing heat transmission of the heat generated in the line sensors 26c and 27c from the sensor housings 38 and 39 to the first housing 37. The heat insulators 67 and 68 are preferably made of a material whose thermal conductivity is lower than or equal to 0.23 W/m·K. More specifically, the material may be, for example, PPS SF 40% grade (i.e. polyphenylene sulfide that contains glass fiber at 40%).

Figure 9:
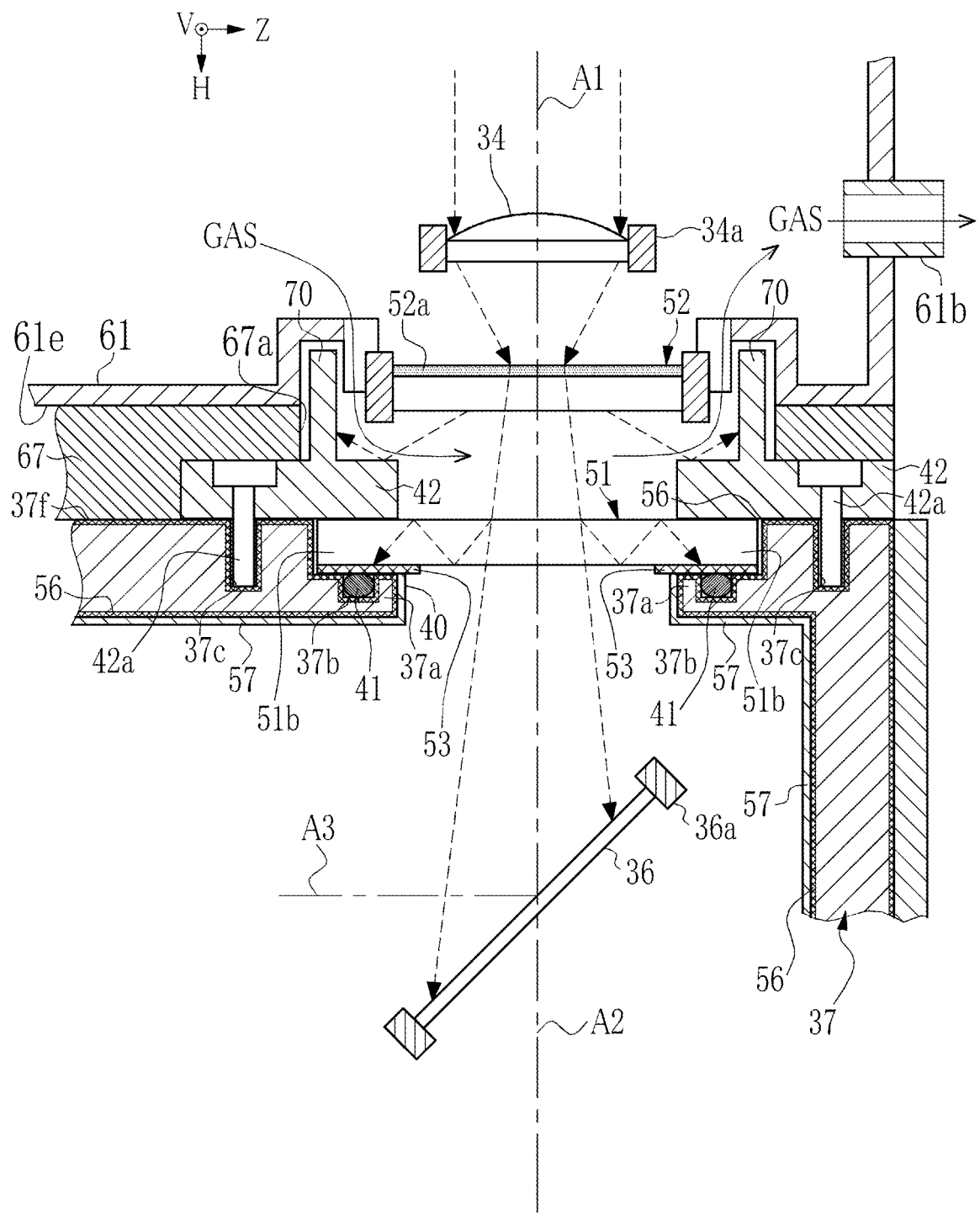
FIG. 9 shows a part of the wavelength measuring device of the third embodiment.

As shown in FIG. 9, the first housing 37 and the second housing 61 are arranged such that the top face 37f and a bottom face 61e face each other. The top face 37f corresponds to a first surface where the input window 51 of the first housing 37 is provided. The bottom face 61e corresponds to a second surface where the diffusing plate (diffusing element) 52 of the second housing 61 is provided. The heat insulator 67 is inserted between the top face 37f and the bottom face 61e. The heat insulator 67 has an opening 67a at a position corresponding to the input window 51. Since the heat insulator 67 is made of an elastic resin, it is deteriorated if it is irradiated with ultraviolet light.

To suppress the diffused light incident on the heat insulator 67 surrounding the opening 67a, a shielding ring 70 is provided. The shielding ring 70 is arranged along the circumference of the opening 67a and shields the heat insulator 67 from the scattered light emitted from the diffusing plate (diffusing element) 52. The shielding ring 70 is formed integrally with the fixing member 42.

Further, the dry nitrogen gas flows not only in the second housing 61 but also in the gap between the diffusing plate 52 and the input window 51.

5.2 Effect

Since the inert gas regularly flows in the second housing 61 during the operation, outgas (e.g. vaporized organic matter) generated in the second housing 61 can be exhausted from the second housing 61. This suppresses the fogging of the optical elements such as the first and second beam splitters 31 and 32, the focusing lens 34, and the diffusing plate 52. Further, even if water vapor enters to the second housing 61, the inert gas flow can exhaust it. Thus, dew condensation on the optical elements is suppressed. If the line narrowed laser apparatus 2A is an ArF excimer laser, the emitted ultraviolet laser light having a wavelength of 193.4 nm is absorbed by oxygen gas and is attenuated. Accordingly, the inert gas flow, which exhausts oxygen gas from the second housing 61, suppresses attenuation of the ultraviolet laser light having a wavelength of 193.4 nm.

Further, since the temperature in the first housing 37 is controlled by the temperature control system to approach the target temperature, the accuracy in the wavelength measurement is stabilized.

6. Wavelength Measuring Device According to Fourth Embodiment 6.1 Configuration

Figure 10:
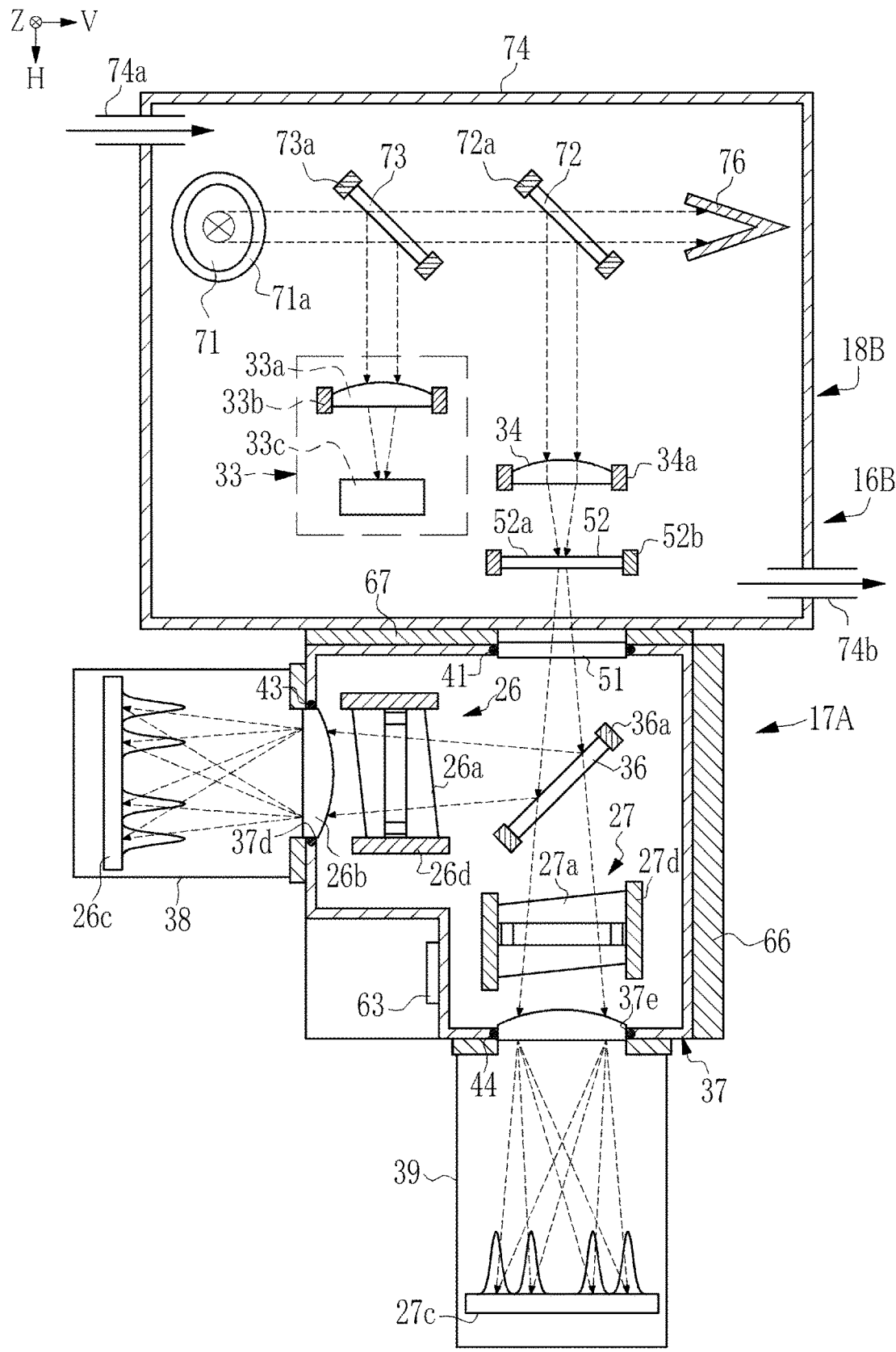
FIG. 10 schematically shows a configuration of a wavelength measuring device of a fourth embodiment.

FIG. 10 shows a wavelength measuring device according to a fourth embodiment, in which a monitoring module 16B is constituted by the first unit 17A and a second unit 18B. The fourth embodiment is different from each of the embodiments described above in an arrangement of the first and second beam splitters 71 and 72 in the second unit 18B. Although it is not shown in FIG. 10, the monitoring module 16B is included in the line narrowed laser apparatus 2A shown in FIG. 3, similarly to each of the embodiments described above, and samples a part of the pulse laser beam, outputted from the output coupling mirror 15 (see FIG. 3) to the exposure apparatus 4. The configuration of the first unit 17A is substantially the same as that described in the third embodiment.

A second housing 74 of the second unit 18B has, similarly to the second housing 61 shown in FIG. 7, an intake port 74a and an emission port 74b. In the second housing 74, inert gas regularly flows during the operation of the laser apparatus. The purpose of the inert gas flow is substantially the same as that described in the third embodiment.

The second housing 74 accommodates the first and second beam splitters 71 and 72, a third beam splitter 73, the focusing lens 34, the diffusing plate 52, and the energy sensor 33. The reference symbol 71a shows a holder for the first beam splitter 71 and the reference symbol 72a shows a holder for the second beam splitter 72.

The first beam splitter 71 has substantially the same function with that of the first beam splitter 31 of each of the embodiments described above. The first beam splitter 71 is provided in the optical path of the pulse laser beam between the output coupling mirror 15 and the exposure apparatus 4 and samples a part of the pulse laser beam. The optical path axis of the pulse laser beam incident on the first beam splitter 71 from the output coupling mirror 15 is parallel to the Z direction where the pulse laser beam is outputted from the output coupling mirror 15. The first beam splitter 71 reflects, in the V direction, a part of the incident light. The pulse laser beam transmitted by the first beam splitter 71 in the Z direction is incident on the exposure apparatus 4.

The second and third beam splitters 72 and 73 are provided downstream from the first beam splitter 71 in an optical path of the reflected light reflected by the first beam splitter 71 in the V direction. The third beam splitter 73 reflects a part of the reflected light reflected by the first beam splitter 71 to the energy sensor 33 and transmits another part.

The first beam splitter 71 is a plane-parallel plate made of synthetic quartz or $CaF_2$ (calcium fluoride). Each side of the plane-parallel plate is polished and is not coated with a partially reflective film. Accordingly, the reflection at the first beam splitter 71 is a Fresnel reflection at each side of the plane-parallel plate. The second and third beam splitters 72 and 73 are substantially the same as the first beam splitter 71 at that point.

The energy sensor 33 includes a sensing device 33c and a focusing lens 33a that converges the light on the sensing device 33c. The sensing device 33c is provided in the vicinity of the focal point of the focusing lens 33a. As described above, the energy sensor 33 measures the pulse energy of the pulse laser beam and outputs the measured data to the laser controller 20.

The light transmitted by the third beam splitter 73 is then incident on the second beam splitter 72. The second beam splitter 72 reflects a part of the incident light and transmits another part. In an optical path of the light transmitted by the second beam splitter 72, a beam damper 76 is arranged.

The beam damper 76 attenuates the light transmitted by the second beam splitter 72 and prevents the transmitted light from scattering in the second housing 74. The beam damper 76 is formed, for example, by connecting two flat plates at one side of each of the flat plates such that the cross-sectional shape of the entire beam damper 76 is substantially a wedge shape. The beam damper 76 is arranged such that the tip of the wedge-shaped cross-section is in the downstream of the light. The beam damper 76 attenuates the light by repeating reflection by the surfaces of the two flat plates facing each other. Alternatively, the beam damper 76 may have a conical shape.

Figure 11:
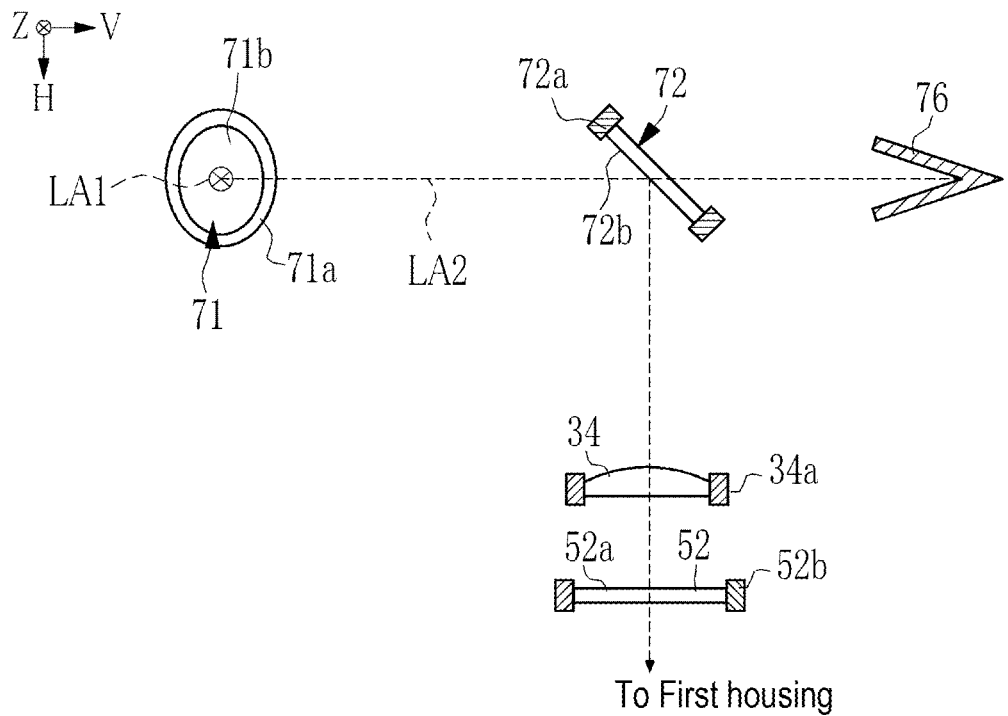
FIG. 11 is a schematic diagram showing a posture of a set of beam splitters in the fourth embodiment.
Figure 12:
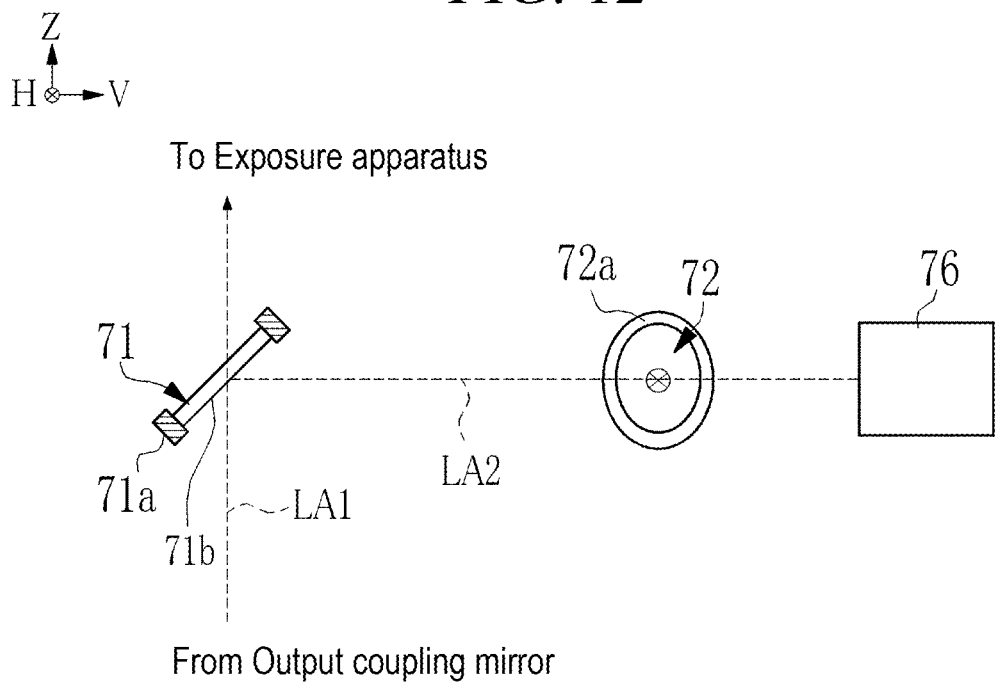
FIG. 12 is a schematic diagram showing the posture of the set of beam splitters as viewed in a direction different from the direction of view in FIG. 11.

FIGS. 11 and 12 show the arrangement and the posture of the first and second beam splitters 71 and 72. The first and second beam splitters 71 and 72 are arranged such that the angles of incidence of the optical path axes LA1 and LA2 of the incident light of the pulse laser beams are each 45° by inclining each of reflective surfaces 71b and 72b by substantially 45°.

The optical path axis of the incident light of the pulse laser beam incident on the first beam splitter 71 is parallel to the Z direction. As shown in FIG. 12, the first beam splitter 71 is arranged such that the reflective surface 71b is inclined by approximately 45° against the optical path axis LA1 of the incident light incident in the Z direction. The first beam splitter 71 thus reflects a part of the incident light in the V direction.

The second beam splitter 72 is provided in an optical path of the reflected light reflected by the first beam splitter 71. The optical path axis LA2 of the incident light of the pulse laser beam incident on the second beam splitter 72 is parallel to the V direction. As shown in FIG. 11, the second beam splitter 72 is arranged such that the reflective surface 72b is inclined by approximately 45° against the optical path axis LA2 of the incident light incident in the V direction. The angle of incidence is thus 45° and the second beam splitter 72 reflects a part of the light in the H direction.

Furthermore, as shown in FIGS. 11 and 12, the first and second beam splitters 71 and 72 are arranged such that the relationship of the polarizing directions of the p-polarized component and the s-polarized component of the pulse laser beam with the plane of incidence of the light incident on the first beam splitter 71 is opposite to that with the plane of incidence of the light incident on the second beam splitter 72. Thus, the plane of incidence of the light incident on the first beam splitter 71 and that on the second beam splitter 72 are crossing at right angles.

The optical path axis LA1 of the light incident on the first beam splitter 71 is parallel to the Z direction and the direction of the reflected light is the V direction. Accordingly, the plane of incidence of the light incident on the first beam splitter 71 is parallel to the VZ plane. Whereas, the optical path axis LA2 of the light incident on the second beam splitter 72 is parallel to the V direction and the direction of the reflected light is the H direction. Accordingly, the plane of incidence of the light incident on the second beam splitter 72 is parallel to the VH plane. The VZ plane and the VH plane are crossing at right angles.

Figure 13:
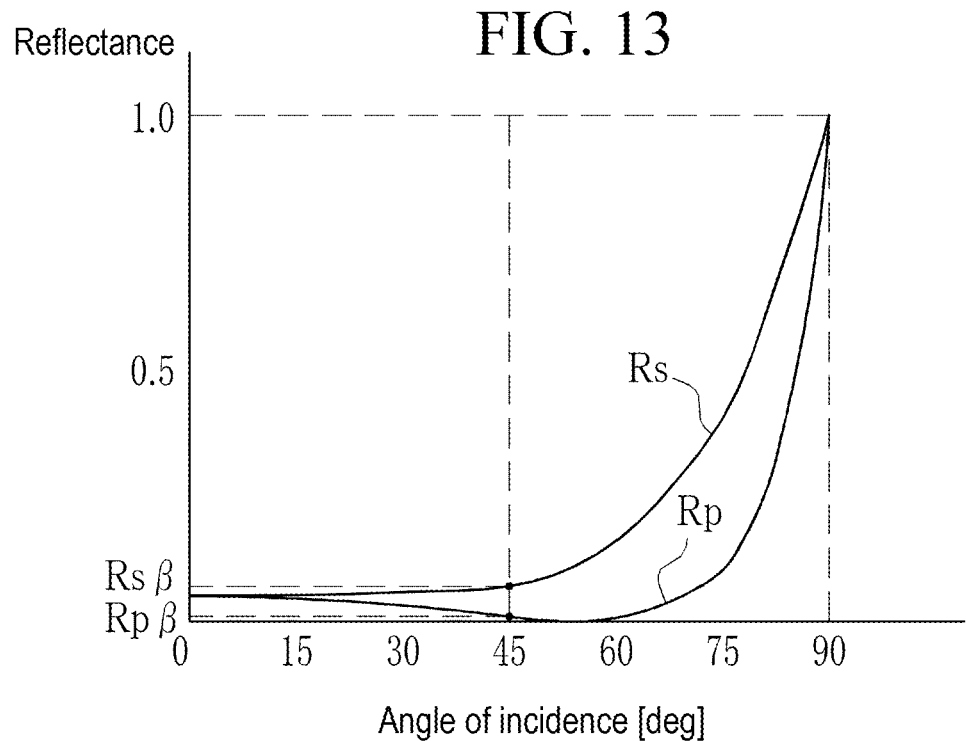
FIG. 13 is a graph showing a relationship of the reflectance versus the angle of incidence of each of p-polarized light and s-polarized light.

FIG. 13 shows relationships between the angles of incidence of p-polarized and s-polarized components and the reflectances Rp and Rs of the respective polarized light components. As is well known, the p-polarized component is a component whose direction of vibration of electric vector is parallel to the plane of incidence and the s-polarized component is a component whose direction of vibration of electric vector is perpendicular to the plane of incidence. As shown in FIG. 13, in a Fresnel reflection, there is a difference between the reflectance Rp of the p-polarized component and the reflectance Rs of the s-polarized component. Such a difference depends on the angle of incidence. For example, in a Fresnel reflection of the ArF excimer laser beam on the $CaF_2$ substrate or the synthetic quartz substrate, if the angle of incidence β is 45°, the reflectance Rpβ of the p-polarized light is approximately 1% and the reflectance Rsβ of the s-polarized light is approximately 7%.

Thus, in a Fresnel reflection, when the light is incident on the first beam splitter 71 at a predetermined angle of incidence, the characteristics of the reflectances Rp and Rs of the first beam splitter 71 determines the ratio of each polarized light component included in the light reflected by the first beam splitter 71. Whether the light is p-polarized or s-polarized is determined according to the posture of the plane of incidence of the first beam splitter 71. For example, when the plane of incidence (i.e. the VZ plane) of the light incident on the first beam splitter 71 inclined by substantially 45° against the optical path axis of the incident light differs substantially by 90° from the plane of incidence (i.e. the VH plane) of the light incident on the second beam splitter 72, the relationship of the polarizing directions of the p-polarized component and the s-polarized component with the plane of incidence of the light incident on the first beam splitter 71 is opposite to that on the second beam splitter 72.

Accordingly, with the arrangement of the first and second beam splitters 71 and 72 as shown in FIGS. 11 and 12, a polarized light component incident on the first beam splitter 71 as a p-polarized light is in turn incident on the second beam splitter 72 as an s-polarized light. Namely, in FIGS. 11 and 12, the plane of incidence (the VZ plane) of the light on the first beam splitter 71 and the plane of incidence (the VH plane) of the light on the second beam splitter 72 are crossing at right angles. Also, the angle of incidence of the pulse laser beam incident on the first beam splitter 71 and that on the second beam splitter 72 are both 45°. According to this arrangement, a polarized light component incident on the first beam splitter 7:1 as a p-polarized light is incident on the second beam splitter 72 as an s-polarized light. Contrary to that, a polarized light component incident on the first beam splitter 71 as an s-polarized light is incident on the second beam splitter 72 as a p-polarized light.

6.2 Effect

As shown in FIGS. 11 and 12, the plane of incidence (the VZ plane) of the pulse laser beam on the first beam splitter 71 and the plane of incidence (the VH plane) of the pulse laser beam on the second beam splitter 72 are crossing at right angles and the angles of incidence of the pulse laser beam on the beam splitters 71 and 72 are the same. According to this, in spite of the change in the ratio of the s-polarized light and the p-polarized light in the light incident on the first beam splitter 71, the total quantity of the emitting light including the s-polarized light and the p-polarized light reflected by the second beam splitter 72 is constant.

Figure 14:
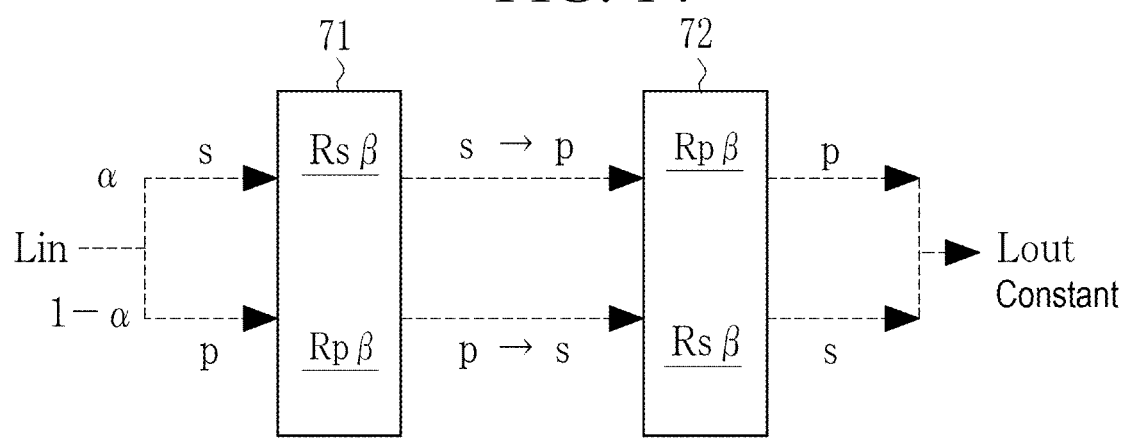
FIG. 14 is a conceptual diagram that explains an effect of the beam splitters of the fourth embodiment.

FIG. 14 is a schematic diagram conceptually explaining the effect of the fourth embodiment. In FIG. 14, Lin is the quantity of incident light incident on the first beam splitter 71, α is the ratio of the s-polarized light in the quantity Lin of incident light, α−1 is the ratio of the p-polarized light, and Rsβ and Rpβ are the reflectances of the light at the angle of incidence β on each of the first and second beam splitters 71 and 72 being 45°. A quantity Lout of emitting light from the second beam splitter 72 is represented by Formula (5).

$$Lout = Lin(\alpha \cdot Rs\beta \cdot Rp\beta + (1-\alpha) \cdot Rp\beta \cdot Rs\beta) = Lin \cdot Rs\beta \cdot Rp\beta \quad \text{Formula (5)}$$

As shown by Formula (5), α, which represents the ratio of the s-polarized light and the p-polarized light included in the quantity Lin of incident light, is canceled in the quantity Lout of emitting light. Regardless of the value of the ratio, the quantity Lout of emitting light is thus constant with the quantity Lin of incident light. This is achieved by the configuration where the plane of incidence (the VZ plane) of the pulse laser beam on the first beam splitter 71 and the plane of incidence (the VH plane) of the pulse laser beam on the second beam splitter 72 are crossing at right angles and the angles of incidence are the same, which reverses the relationship between the p-polarized light and the s-polarized light.

Here, in the configuration described in FIGS. 11, 12, and 13, the third beam splitter 73 is not disposed between the first and second beam splitters 71 and 72. In FIG. 10, the third beam splitter 73 in the same posture with the second beam splitter 72 is added between the first and second beam splitters 71 and 72.

In the configuration including the third beam splitter 73, the quantity Lout of emitting light from the second beam splitter 72 is not completely constant with the quantity Lin of incident light on the first beam splitter 71. However, the arrangement of the first and second beam splitters 71 and 72 as shown in FIGS. 11 and 12 achieves, as compared to a configuration without such arrangement of the first and second beam splitters 71 and 72, suppressing the change in the quantity Lout of emitting light from the second beam splitter 72 with the change in the quantity Lin of incident light on the first beam splitter 71.

This is explained as follows. The third beam splitter 73 is a plane-parallel plate made of CaF$_2$ or synthetic quartz as described above similarly to the first and second beam splitters 71 and 72, without being coated with a partially reflective film. In that case, as shown in FIG. 13, the reflectance is low when the angle of incidence β is 45°. The reflectance Rpβ of the p-polarized light is approximately 1% and the reflectance Rsβ of the s-polarized light is approximately 7%. Thus, the majority of the pulse laser beam transmitted by the first beam splitter 71 is transmitted by the third beam splitter 73 and is incident on the second beam splitter 72. Approximately 99% of the p-polarized light and approximately 93% of the s-polarized light may be transmitted by the third beam splitter 73. Accordingly, the ratio of the p-polarized light and the s-polarized light in the pulse laser beam transmitted by the first beam splitter 71 and incident on the second beam splitter 72 does not greatly change depending on the presence of the third beam splitter 73 between the beam splitters 71 and 72.

Thus, even if the third beam splitter 73 is added, the arrangement shown in FIGS. 11 and 12 suppresses the change in the quantity Lout of emitting light from the second beam splitter 72 with the change in the quantity Lin of incident light on the first beam splitter 71.

Further, in the configuration shown in FIG. 10, the quantity Lout of emitting light from the third beam splitter 73 becomes constant with the quantity Lin of incident light on the first beam splitter 71. The quantity Lout of emitting light, corresponding to the light reflected by the third beam splitter 73, is used for the measurement of the pulse energy of the pulse laser beam measured by the energy sensor 33. In the configuration in FIG. 10, the quantity of light incident on the energy sensor 33 is stabilized with the quantity of incident light on the first beam splitter 71 and the pulse energy of the pulse laser beam can be detected at a high accuracy.

The first beam splitter 71 corresponds to a first beam splitter. The second beam splitter 72 or the third beam splitter 73 corresponds to a second beam splitter.

In the fourth embodiment, the angles of incidence of the pulse laser beam on the first, second, and third beam splitters 71, 72, and 73 are 45°. However, if the angles of incidence are the same, they may be other than 45°. The angles of incidence may be selected according to the direction of the reflected light or the quantity of light. When the angle of incidence is 45°, for each of the beam splitters 71 to 73, the optical path of the pulse laser beam transmitted by the beam splitter and that reflected by the beam splitter will be crossing at right angles. The beam splitters 71 to 73 are thus capable of being arranged compactly.

7. Wavelength Measuring Device According to Reference Example

Figure 15:
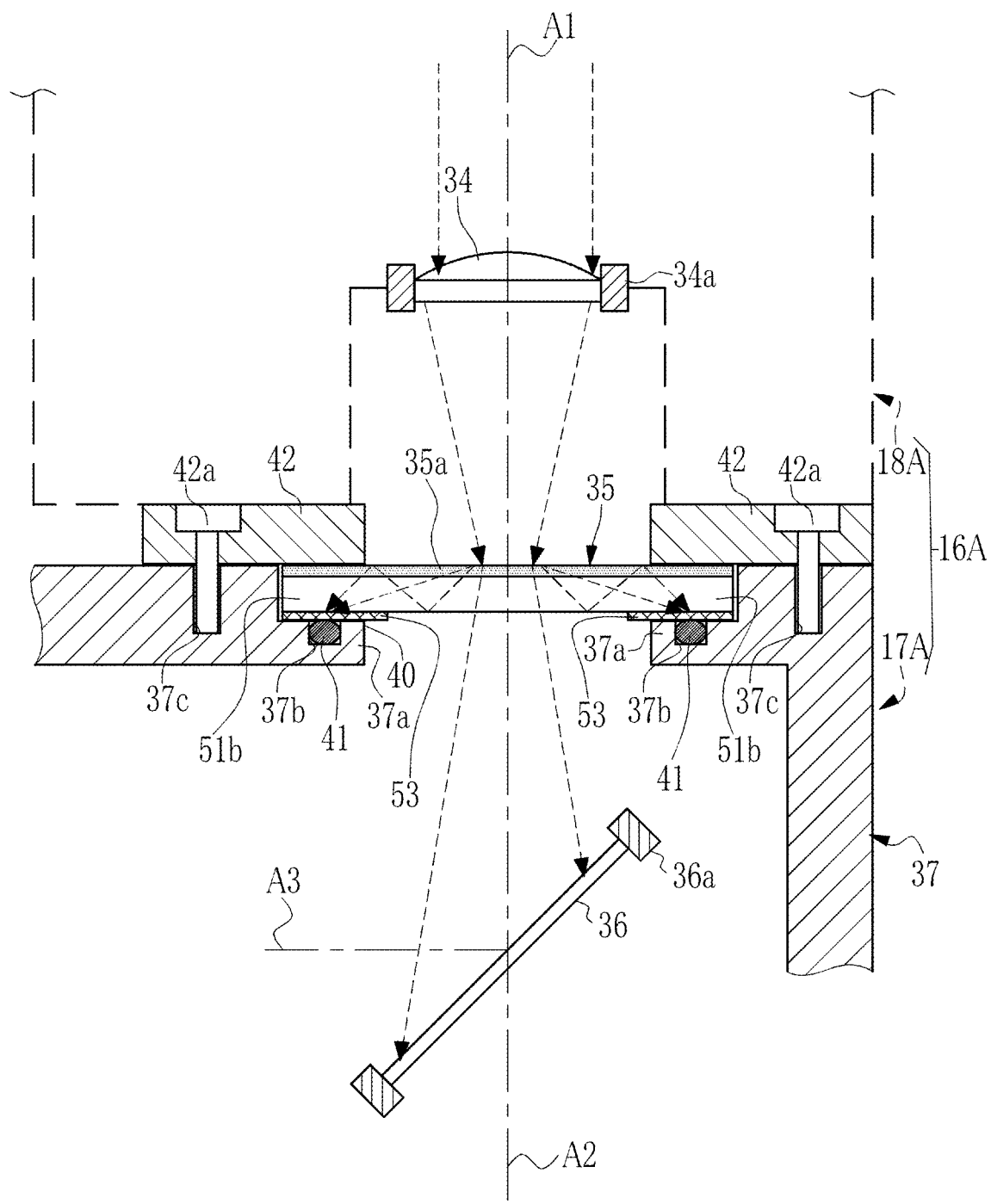
FIG. 15 shows a part of a wavelength measuring device of a reference example.

FIG. 15 shows a wavelength measuring device according to a reference example, which has substantially the same configuration as the wavelength measuring device according to the comparative example shown in FIG. 1. The difference from the comparative example is that the shielding film 53 of the first embodiment shown in FIG. 4 is provided on the rim part of the diffusing plate 35. Adding the shielding film 53 to the diffusing plate 52 of the comparative example prevents the O-ring 41 from being irradiated with the pulse laser beam and suppresses the deterioration of the O-ring 41. In the reference example, however, it is necessary to break the seal of the first housing 37 to replace the diffusing plate 35. It is more preferable that the diffusing plate 52 is arranged outside of the first housing 37 as with the diffusing plate 52 of the embodiments described above.

8. Others

In each of the embodiments described above, the wavelength measuring device includes two or more etalons 26a and 27a arranged in the first housing 37. However, the number of etalons is not necessarily two or more. The wavelength measuring device of the present disclosure may include at least one etalon.

The above descriptions are intended to be only illustrative rather than being limiting. Accordingly, it will be clear to those skilled in the art that various changes may be made to the embodiments of the present disclosure without departing from the scope of the appended claims.

The terms used in the present specification and the appended claims are to be interpreted as not being limiting. For example, the term "include" or "included" should be interpreted as not being limited to items described as being included. Further, the term "have" should be interpreted as not being limited to items described as being had. Furthermore, the modifier "a" or "an" as used in the present specification and the appended claims should be interpreted as meaning "at least one" or "one or more".

The invention claimed is:

1. A wavelength measuring device configured to detect a wavelength of ultraviolet laser light outputted from a laser resonator with at least one etalon, the wavelength measuring device comprising:
   a first housing having an interior space being sealed and accommodating the etalon;
   an input window through which the ultraviolet laser light enters to the first housing, the input window being provided at a first opening of the first housing;
   a first sealing member configured to seal a gap between a rim part of the input window and a circumferential portion of the first opening;

a shielding film provided between the rim part of the input window and the first sealing member and configured to shield the first sealing member from the ultraviolet laser light coming from the input window; and a diffusing element provided outside of the first housing and configured to diffuse the ultraviolet laser light before being incident on the input window;

wherein the first housing includes aluminum;

wherein at least a part of each of an inner surface and an outer surface of the first housing has a nickel plating layer; and wherein the wavelength measuring device further comprises a cover member, the cover member covering the part of the inner surface of the first housing on which the nickel plating layer is provided, the cover member including at least one of aluminum and stainless steel and not including a nickel plating layer on a surface of the cover member.

2. The wavelength measuring device according to claim 1, wherein
the shielding film includes aluminum, and
a surface of the shielding film has a protective film that contacts the first sealing member.

3. The wavelength measuring device according to claim 1, wherein the diffusing element includes a plane-parallel plate being configured to transmit the ultraviolet laser light and having at least one roughened surface.

4. The wavelength measuring device according to claim 1, wherein the input window includes synthetic quartz.

5. The wavelength measuring device according to claim 1, wherein a reflectance of the shielding film for ultraviolet light is higher than an absorptance of the shielding film for the ultraviolet light.

6. The wavelength measuring device according to claim 1, wherein the first sealing member is an O-ring including elastic resin.

7. The wavelength measuring device according to claim 1, further comprising:
a heater provided on an outer circumferential surface of the first housing and configured to adjust a temperature at the interior space;
a temperature sensor configured to measure the temperature at the interior space; and
a temperature control unit configured to control driving of the heater based on the temperature measured by the temperature sensor.

8. The wavelength measuring device according to claim 1, wherein the etalon includes a first etalon and a second etalon that has a resolving power higher than the first etalon.

9. The wavelength measuring device according to claim 8, further comprising:
a first image sensor provided outside of the first housing and configured to photograph first transmitted light of the ultraviolet laser light transmitted by the first etalon;
a second image sensor provided outside of the first housing and configured to photograph second transmitted light of the ultraviolet laser light transmitted by the second etalon;
a first output window provided at a second opening of the first housing and configured to output the first transmitted light to the outside of the first housing and function as a focusing lens to converge the first transmitted light on the first image sensor;
a second output window provided at a third opening of the first housing and configured to output the second transmitted light to the outside of the first housing and function as a focusing lens to converge the second transmitted light on the second image sensor;
a second sealing member configured to seal a gap between a rim part of the first output window and a circumferential portion of the second opening; and
a third sealing member configured to seal a gap between a rim part of the second output window and a circumferential portion of the third opening.

10. The wavelength measuring device according to claim 1, further comprising:
a first beam splitter configured to reflect a part of the ultraviolet laser light outputted from the laser resonator and transmit another part;
a focusing lens configured to emit and converge at least a part of the ultraviolet laser light reflected by the first beam splitter toward the diffusing element; and
a second housing configured to accommodate the focusing lens.

11. The wavelength measuring device according to claim 10, wherein the diffusing element is provided at a position downstream from the focusing lens and shifted from a focal point of the focusing lens.

12. The wavelength measuring device according to claim 10, wherein the diffusing element is provided in the second housing.

13. The wavelength measuring device according to claim 12, wherein
the first housing and the second housing are arranged such that a first surface of the first housing and a second surface of the second housing face each other, the first surface being a surface on which the input window is provided and the second surface being a surface on which the diffusing element is provided, and
the wavelength measuring device further comprises:
a heat insulator inserted between the first surface and the second surface, the heat insulator having an opening formed at a position corresponding to the input window; and
a shielding ring provided along the circumference of the opening and configured to shield the heat insulator from the diffused light coming from the diffusing element.

14. The wavelength measuring device according to claim 10, further comprising:
a second beam splitter provided in the second housing and downstream from the first beam splitter, the beam splitter being configured to reflect a part of the ultraviolet laser light reflected by the first beam splitter and transmit another part, wherein
angles of incidence of the ultraviolet laser light on the first beam splitter and that on the second beam splitter are substantially the same, and
planes of incidence of the ultraviolet laser light on the first beam splitter and that on the second beam splitter are crossing at right angles.

15. The wavelength measuring device according to claim 14, wherein the angles of incidence of the ultraviolet laser light on the first beam splitter and that on the second beam splitter are both 45°.

16. The wavelength measuring device according to claim 14, further comprising:
a beam damper configured to absorb the ultraviolet laser light transmitted by the second beam splitter.

17. A wavelength measuring device configured to detect a wavelength of ultraviolet laser light outputted from a laser resonator with at least one etalon, the wavelength measuring device comprising:

a first housing having an interior space being sealed and accommodating the etalon;

an input window through which the ultraviolet laser light enters to the first housing, the input window being provided at a first opening of the first housing;

a first sealing member configured to seal a gap between a rim part of the input window and a circumferential portion of the first opening;

a shielding film provided between the rim part of the input window and the first sealing member and configured to shield the first sealing member from the ultraviolet laser light coming from the input window; and a diffusing element provided outside of the first housing and configured to diffuse the ultraviolet laser light before being incident on the input window;

wherein the etalon includes a first etalon and a second etalon that has a resolving power higher than the first etalon.

18. The wavelength measuring device according to claim 17, further comprising:

a first image sensor provided outside of the first housing and configured to photograph first transmitted light of the ultraviolet laser light transmitted by the first etalon;

a second image sensor provided outside of the first housing and configured to photograph second transmitted light of the ultraviolet laser light transmitted by the second etalon;

a first output window provided at a second opening of the first housing and configured to output the first transmitted light to the outside of the first housing and function as a focusing lens to converge the first transmitted light on the first image sensor;

a second output window provided at a third opening of the first housing and configured to output the second transmitted light to the outside of the first housing and function as a focusing lens to converge the second transmitted light on the second image sensor;

a second sealing member configured to seal a gap between a rim part of the first output window and a circumferential portion of the second opening; and a third sealing member configured to seal a gap between a rim part of the second output window and a circumferential portion of the third opening.

19. The wavelength measuring device according to claim 17, further comprising:

a first beam splitter configured to reflect a part of the ultraviolet laser light outputted from the laser resonator and transmit another part;

a focusing lens configured to emit and converge at least a part of the ultraviolet laser light reflected by the first beam splitter toward the diffusing element; and a second housing configured to accommodate the focusing lens;

wherein the diffusing element is provided in the second housing;

wherein the first housing and the second housing are arranged such that a first surface of the first housing and a second surface of the second housing face each other, the first surface being a surface on which the input window is provided and the second surface being a surface on which the diffusing element is provided; and wherein the wavelength measuring device further comprises:

a heat insulator inserted between the first surface and the second surface, the heat insulator having an opening formed at a position corresponding to the input window; and a shielding ring provided along the circumference of the opening and configured to shield the heat insulator from the diffused light coming from the diffusing element.

20. The wavelength measuring device according to claim 17, further comprising:

a first beam splitter configured to reflect a part of the ultraviolet laser light outputted from the laser resonator and transmit another part;

a focusing lens configured to emit and converge at least a part of the ultraviolet laser light reflected by the first beam splitter toward the diffusing element;

a second housing configured to accommodate the focusing lens;

a second beam splitter provided in the second housing and downstream from the first beam splitter, the beam splitter being configured to reflect a part of the ultraviolet laser light reflected by the first beam splitter and transmit another part; and a beam damper configured to absorb the ultraviolet laser light transmitted by the second beam splitter;

wherein angles of incidence of the ultraviolet laser light on the first beam splitter and that on the second beam splitter are substantially the same, and wherein planes of incidence of the ultraviolet laser light on the first beam splitter and that on the second beam splitter are crossing at right angles.

\* \* \* \* \*